US008772167B2

(12) United States Patent
Seo et al.

(10) Patent No.: US 8,772,167 B2
(45) Date of Patent: Jul. 8, 2014

(54) METHOD OF FORMING A SEMICONDUCTOR MEMORY DEVICE

(75) Inventors: JungWoo Seo, Hwaseong-si (KR);
Kyoung Ryul Yoon, Yongin-si (KR);
Kukhan Yoon, Hwaseong-si (KR)

(73) Assignee: Samsung Electronics Co., Ltd.,
Suwon-si, Gyeonggi-do (KR)

( * ) Notice: Subject to any disclaimer, the term of this patent is extended or adjusted under 35 U.S.C. 154(b) by 0 days.

(21) Appl. No.: 13/587,996

(22) Filed: Aug. 17, 2012

(65) Prior Publication Data

US 2013/0095663 A1   Apr. 18, 2013

(30) Foreign Application Priority Data

Oct. 17, 2011  (KR) .................. 10-2011-0106019

(51) Int. Cl.
*H01L 21/311*  (2006.01)
(52) U.S. Cl.
USPC .............................. 438/696; 216/46
(58) Field of Classification Search
USPC ............................... 216/46; 438/696
See application file for complete search history.

(56) References Cited

U.S. PATENT DOCUMENTS

2010/0120258 A1*  5/2010  Kim .............................. 438/745

FOREIGN PATENT DOCUMENTS

KR   10-2001-0073304 A   8/2001
KR   10-2010-0053852 A   5/2010
KR   10-2010-0102422 A   9/2010

* cited by examiner

*Primary Examiner* — Roberts Culbert
(74) *Attorney, Agent, or Firm* — Lee & Morse, P.C.

(57) ABSTRACT

A method of forming a semiconductor memory device includes forming an etch target layer on a substrate, forming a sacrificial layer having preliminary openings on the etch target layer, forming assistance spacers in the preliminary openings, respectively, removing the sacrificial layer, such that the assistance spacers remain on the etch target layer, forming first mask spacers covering inner sidewalls of the assistance spacers, respectively, the first mask spacers respectively defining first openings, forming a second mask spacer covering outer sidewalls of the assistance spacers, the second mask spacer defining second openings between the first openings, the first and second openings being adjacent to each other along a first direction, and etching the etch target layer exposed by the first openings and the second openings to form holes in the etch target layer.

20 Claims, 39 Drawing Sheets

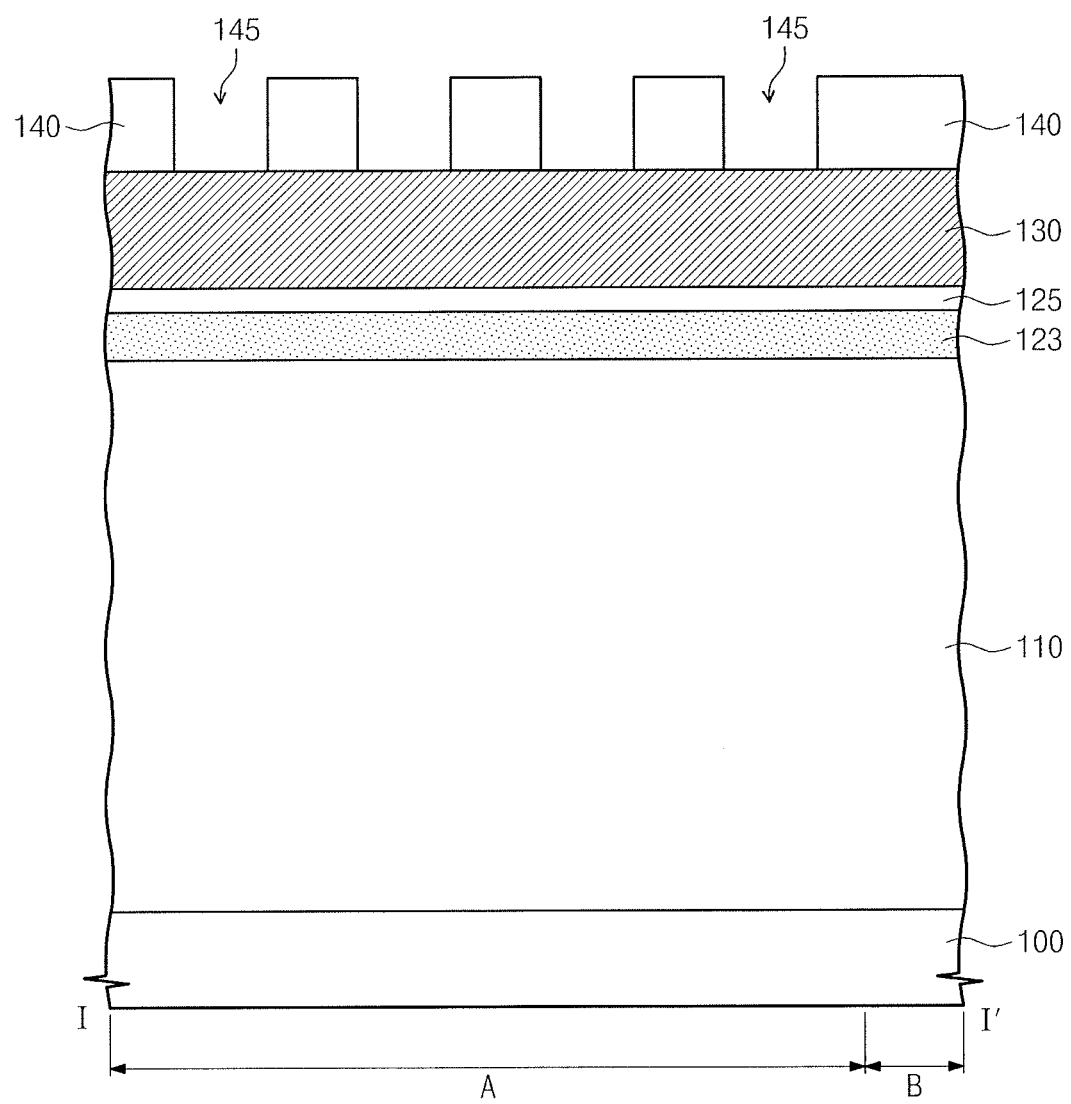

METHOD OF FORMING A SEMICONDUCTOR MEMORY DEVICE

CROSS-REFERENCE TO RELATED APPLICATIONS

This U.S. non-provisional patent application claims priority under 35 U.S.C. §119 to Korean Patent Application No. 10-2011-0106019, filed on Oct. 17, 2011, the entirety of which is incorporated by reference herein.

BACKGROUND

1. Field

The inventive concept relates to a method of forming a semiconductor memory device and, more particularly, to a method of forming a semiconductor memory device including a hole.

2. Description of the Related Art

The degree of integration of semiconductor memory devices has been increased for satisfying excellent performance and low cost required by user. Since the degree of integration of the semiconductor memory devices is an important factor determining cost of the semiconductor devices, semiconductor devices of high integration have been demanded. However, high cost equipment may be required for the formation of fine patterns in such semiconductor devices. Thus, there may be limitations in improving the process technology for forming the fine patterns due to the high cost equipment and/or difficulty of the process technology.

Various research has been conducted for overcoming the limitation of forming the fine patterns by using a manufacturing process technique. In other words, various research has been conducted for methods of forming the fine patterns for realizing a high integration semiconductor memory device without the use of the high cost equipment.

SUMMARY

Embodiments of the inventive concept may provide methods of forming a semiconductor memory device with high integration.

Embodiments of the inventive concept may also provide methods of forming a semiconductor memory device capable of reducing a manufacturing cost.

In one aspect, a method of forming a semiconductor memory device may include forming an etch target layer on a substrate, forming a sacrificial layer having preliminary openings on the etch target layer, forming assistance spacers in the preliminary openings, respectively, removing the sacrificial layer, such that the assistance spacers remain on the etch target layer, forming first mask spacers covering inner sidewalls of the assistance spacers, respectively, the first mask spacers respectively defining first openings, forming a second mask spacer covering outer sidewalls of the assistance spacers, the second mask spacer defining second openings between the first openings, the first and second openings being adjacent to each other along a first direction, and etching the etch target layer exposed by the first openings and the second openings to form holes in the etch target layer.

Defining the first openings may include forming the first openings two-dimensionally along rows and columns when viewed from a plan view, such that the rows are along a second direction and the columns are along a third direction crossing the second direction, and the first direction is non-parallel and non-perpendicular to the second and third directions.

Forming the first mask spacers and forming the second mask spacer may be simultaneous.

Forming the first mask spacers and the second mask spacer may include forming a mask spacer layer on the etch target layer and the assistance spacers, and etching the mask spacer layer until a top surface of the etch target layer is exposed.

Forming the mask spacer layer may include depositing the mask spacer layer to a deposition thickness greater than a half of the shortest distance between a pair of the assistance spacers adjacent to each other in the second direction and a half of the shortest distance between a pair of the assistance spacers adjacent to each other in the third direction.

Forming the second mask spacer may include filling with the second mask spacer a part of a space between the assistance spacers adjacent to each other in the second direction and a part of a space between the assistance spacers adjacent to each other in the third direction.

A distance between center points of two holes adjacent to each other in the first direction is represented as $R_3$, a distance between center points of two holes adjacent to each other in the second direction is represented as $R_2$, a distance between center points of two holes adjacent to each other in the third direction is represented as $R_1$, and $R_3$ is represented by the following formula: $R_3 = ((R_1^2 + R_2^2)/4)^{1/2}$.

The $R_1$ may equal to the $R_2$, and $R_3$ may be represented by the following formula: $R_3 = R_1/(2^{1/2})$.

The method may further include performing an isotropic etching process on the sacrificial layer having the preliminary openings to enlarge the preliminary openings.

Forming the sacrificial layer may include using a material having an etch selectivity with respect to the etch target layer and the assistance spacers.

In another aspect, a method of forming a semiconductor memory device may include forming an etch target layer on a substrate, forming a plurality of assistance spacers on the etch target layer, the assistance spacers being spaced apart from etch other, and each of the assistance spacers defining an inner space exposing the etch target layer, forming a mask spacer layer on the etch target layer to fill a part of a space between the assistance spacers adjacent to each other, anisotropically etching the mask spacer layer until the etch target layer is exposed, such that openings exposing the etch target layer are formed, and forming holes by etching the etch target layer exposed through the openings.

Forming the mask spacer layer may include depositing the mask spacer layer to a thickness that is greater than a half of the shortest distance between adjacent assistance spacers.

Forming the openings may include arranging the openings two-dimensionally in rows along a first direction and in columns along a second direction when viewed from a plan view, the second direction being perpendicular to the first direction, wherein center points of the openings arranged in two adjacent rows are misaligned in the second direction, and wherein center points of the openings arranged in two adjacent columns are misaligned in the first direction.

Forming the openings may include forming first openings in one column of the two adjacent columns by etching through the defined inner spaces of the assistance spacers, and forming second openings in the other column of the two adjacent columns by etching between the assistance spacers.

In yet another aspect, a method of forming a semiconductor memory device may include forming an etch target layer on a substrate, forming a plurality of assistance spacers on the etch target layer, forming first mask spacers on inner sidewalls of the assistance spacers, the first mask spacers defining first openings in centers of the assistance spacers, forming a second mask spacer on outer sidewalls of the assistance spacers, the second mask spacer defining second openings, each second opening being between two adjacent first openings along a first direction, and etching the etch target layer through the first and second openings to form holes in the etch target layer.

Forming the plurality of assistance spacers may include forming a two dimensional matrix of assistance spacers, each spacer defining an inner space therein, and forming the second openings along the first direction includes forming the second openings along a diagonal direction of the matrix.

Forming the first mask spacers may include defining a size of the assistance spacers by a minimal distance of a lithography equipment, such that the first openings in respective centers of the assistance spacers are formed at the minimal distance of the lithography equipment, and forming the second mask spacer may include forming the assistance spacers with small distances therebetween, such that a deposition thickness of a mask spacer layer is greater than a half of the shortest distance between a pair of the assistance spacers in a second or third direction, the second and third directions being perpendicular to each other.

Forming the assistance spacers may include forming preliminary openings through a sacrificial layer, centers of the preliminary openings being defined by the minimal distance of the lithography equipment, etching the preliminary openings to expand diameters thereof, such that distances between the expanded preliminary openings along the second and third directions are reduced, coating inner sidewalls of the preliminary openings, and removing the sacrificial layer, such that the coating on the inner sidewalls of the preliminary openings defines the assistance spacers.

Forming the holes may include forming a matrix with a plurality of first and second columns, the first and second columns being arranged to alternate and be offset with respect to each other.

Forming the holes may include forming the first columns to include the first openings and the second columns to include the second openings, centers of the first openings being misaligned with respect to centers of the second openings.

BRIEF DESCRIPTION OF THE DRAWINGS

Features will become apparent to those of ordinary skill in the art by describing in detail exemplary embodiments with reference to the attached drawings, in which:

FIGS. 1A to 10A illustrate plan views of stages in a method of forming a semiconductor memory device according to an embodiment of the inventive concept;

FIGS. 1B to 10B illustrate cross-sectional views along lines I-I' of FIGS. 1A to 10A, respectively;

FIGS. 1C to 7C illustrate cross-sectional views along lines II-II' of FIGS. 1A to 7A, respectively;

FIGS. 11A to 15A illustrate plan views of stages in a method of forming a semiconductor memory device according to another embodiment of the inventive concept;

FIGS. 11B to 15B illustrate cross-sectional views along lines I-I' of FIGS. 11A to 15A, respectively;

DETAILED DESCRIPTION

Figure 1A:
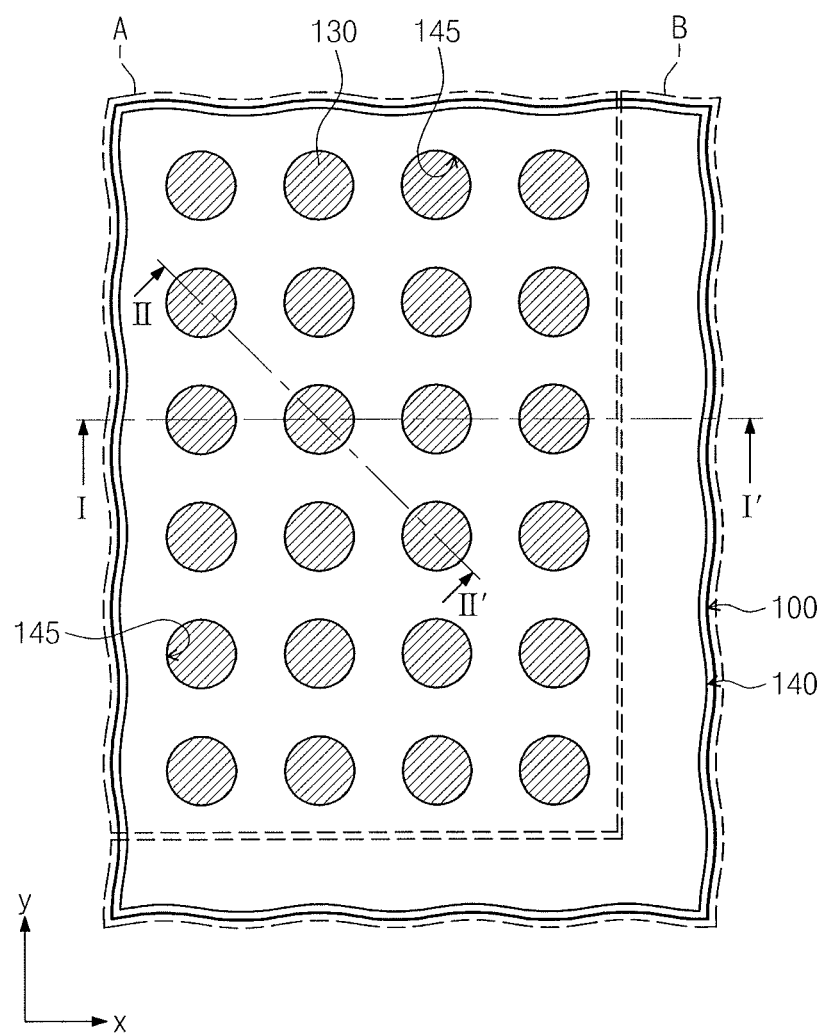

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the invention to those skilled in the art.

In the drawing figures, the dimensions of layers and regions may be exaggerated for clarity of illustration. It will also be understood that when a layer (or element) is referred to as being "on" another layer or substrate, it can be directly on the other layer or substrate, or intervening layers may also be present. In addition, it will also be understood that when a layer is referred to as being "between" two layers, it can be the only layer between the two layers, or one or more intervening layers may also be present. It will be understood that when a layer referred to as being "connected" or "coupled" to another layer, it may be directly connected or coupled to the other layer or intervening layers may be present. Like reference numerals refer to like elements throughout.

The terminology used herein is for the purpose of describing particular embodiments only and is not intended to limit the invention. As used herein, the singular terms "a," "an" and "the" are intended to include the plural forms as well, unless the context clearly indicates otherwise. As used herein, the term "and/or" includes any and all combinations of one or more of the associated listed items.

It will be further understood that the terms "comprises", "comprising", "includes" and/or "including", when used herein, specify the presence of stated features, integers, steps, operations, elements, and/or components, but do not preclude the presence or addition of one or more other features, integers, steps, operations, elements, components, and/or groups thereof.

Additionally, the embodiment in the detailed description will be described with sectional views as ideal exemplary views of the inventive concept. Accordingly, shapes of the exemplary views may be modified according to manufacturing techniques and/or allowable errors. Therefore, the embodiments of the inventive concept are not limited to the specific shape illustrated in the exemplary views, but may include other shapes that may be created according to manufacturing processes. Areas exemplified in the drawings have general properties, and are used to illustrate specific shapes of elements. Thus, this should not be construed as limited to the scope of the inventive concept.

It will be also understood that although the terms first, second, third etc. may be used herein to describe various elements, these elements should not be limited by these terms. These terms are only used to distinguish one element from another element. Thus, a first element in some embodiments could be termed a second element in other embodiments without departing from the teachings of the present invention. Exemplary embodiments of aspects of the present inventive concept explained and illustrated herein include their complementary counterparts. The same reference numerals or the same reference designators denote the same elements throughout the specification.

Hereinafter, a method of forming a semiconductor memory device according to an embodiment of the inventive concept will be described in more detail with reference to the drawings. FIGS. 1A to 10A are plan views of stages in a method of forming a semiconductor memory device according to an embodiment of the inventive concept, FIGS. 1B to 10B are cross-sectional views taken along lines I-I' of FIGS. 1A to 10A, respectively, and FIGS. 1C to 7C are cross-sectional views taken along lines II-II' of FIGS. 1A to 7A, respectively.

Figure 1C:
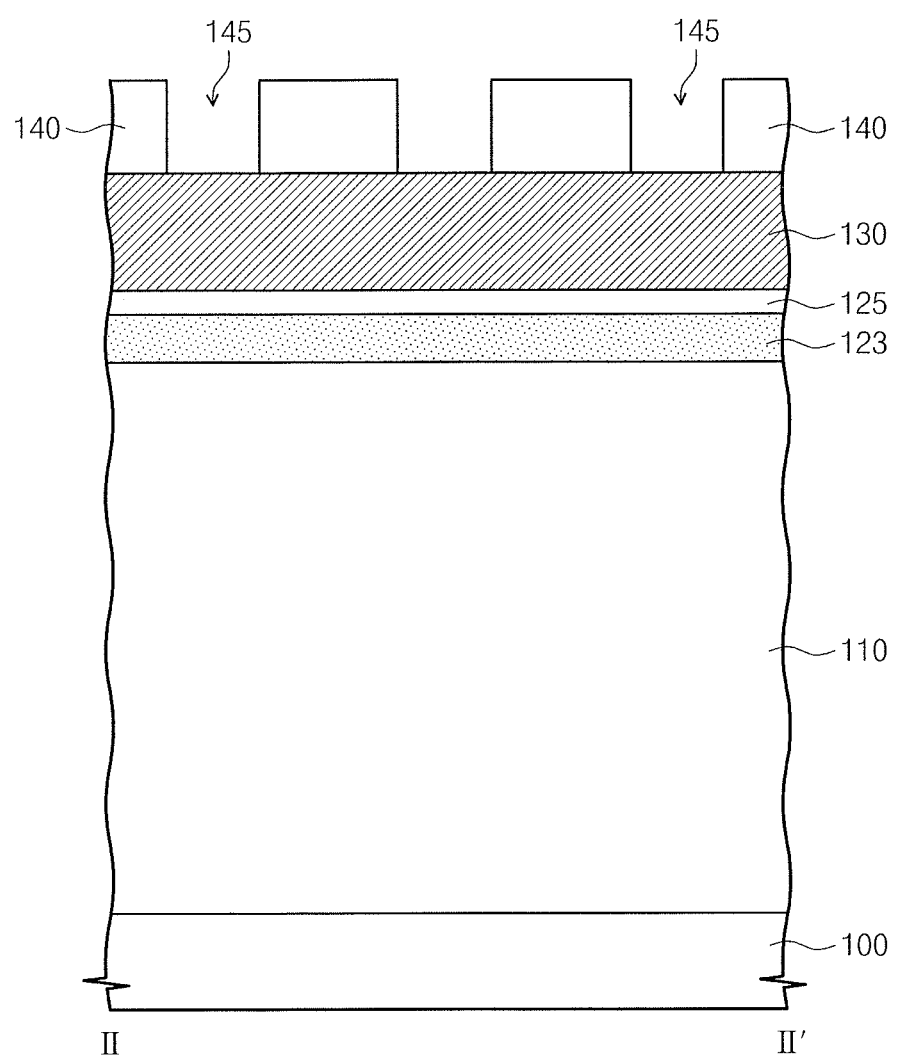

Referring to FIGS. 1A, 1B, and 1C, a mold layer 110 may be formed on a substrate 100 including a cell region A and a peripheral region B. The mold layer 110 may be an etch target layer. The substrate 100 may include a silicon substrate, a germanium substrate, or a silicon-germanium substrate. Even though not illustrated in the drawings, the substrate 100 may include a plurality of wordlines and a plurality of bitlines crossing the wordlines. Additionally, the substrate 100 may further include doped regions disposed at both sides of each of the wordlines and contact plugs connected to the doped regions.

The mold layer 110 may include a dielectric material. For example, the mold layer 110 may include at least one of an oxide layer, a nitride layer, and an oxynitride layer. In some embodiments, the mold layer 110 may be formed by a physical vapor deposition (PVD) process and/or a chemical vapor deposition (CVD) process.

A supporting layer 123 may be formed on the mold layer 110. The supporting layer 123 may be formed of a material having an etch selectivity with respect to the mold layer 110. For example, the mold layer 110 may be a silicon oxide layer and the supporting layer 123 may be a silicon nitride layer.

A mask layer 130 may be formed on the supporting layer 123. The mask layer 130 may be formed of a material having an etch selectivity with respect to the supporting layer 123 and the mold layer 110. For example, if the mold layer 110 is a silicon oxide layer and the supporting layer 123 is a silicon nitride layer, the mask layer 130 may be a poly-silicon layer. However, the inventive concept is not limited thereto. The mask layer 130 may be formed of various materials having a high etch selectivity with respect to the supporting layer 123 and the mold layer 110.

A buffer oxide layer 125 may be formed between the mask layer 130 and the supporting layer 123. The buffer oxide layer 125 may be formed of a material having a high etch selectivity with respect to the mask layer 130. For example, if the mask layer 130 is formed of poly-silicon, the buffer oxide layer 125 may be formed of a silicon oxide layer. In some embodiments, the buffer oxide layer 125 may function as an etch stop layer in a subsequent process. In other embodiments, the buffer oxide layer 125 may be omitted.

A sacrificial layer 140 may be formed on the mask layer 130. The sacrificial layer 140 may be formed of a material having a high etch selectivity with respect to the mask layer 130. For example, if the mask layer 130 is formed of poly-silicon, the sacrificial layer 140 may be formed of a silicon oxide layer, a silicon nitride layer, and/or a silicon oxynitride layer. Alternatively, the sacrificial layer 140 may be formed of a spin-on-hardmask (SOH). However, the inventive concept is not limited thereto. The sacrificial layer 140 may be formed of various materials having an etch selectivity with respect to the mask layer 130.

A pattering process may be performed on the sacrificial layer 140 to form a plurality of preliminary openings 145 in the sacrificial layer 140 of the cell region A. The preliminary openings 145 may expose a top surface of the mask layer 130. The preliminary openings 145 may be spaced apart from each other and may be two-dimensionally arranged along rows and columns in the cell region A when viewed from a plan view, as illustrated in FIG. 1A. The rows may be parallel to a first direction and the columns may be parallel to a second direction. The second direction may cross the first direction. In some embodiments, the rows may be parallel to an x-axis and the columns may be parallel to a y-axis, as illustrated in FIG. 1A.

Figure 2A:
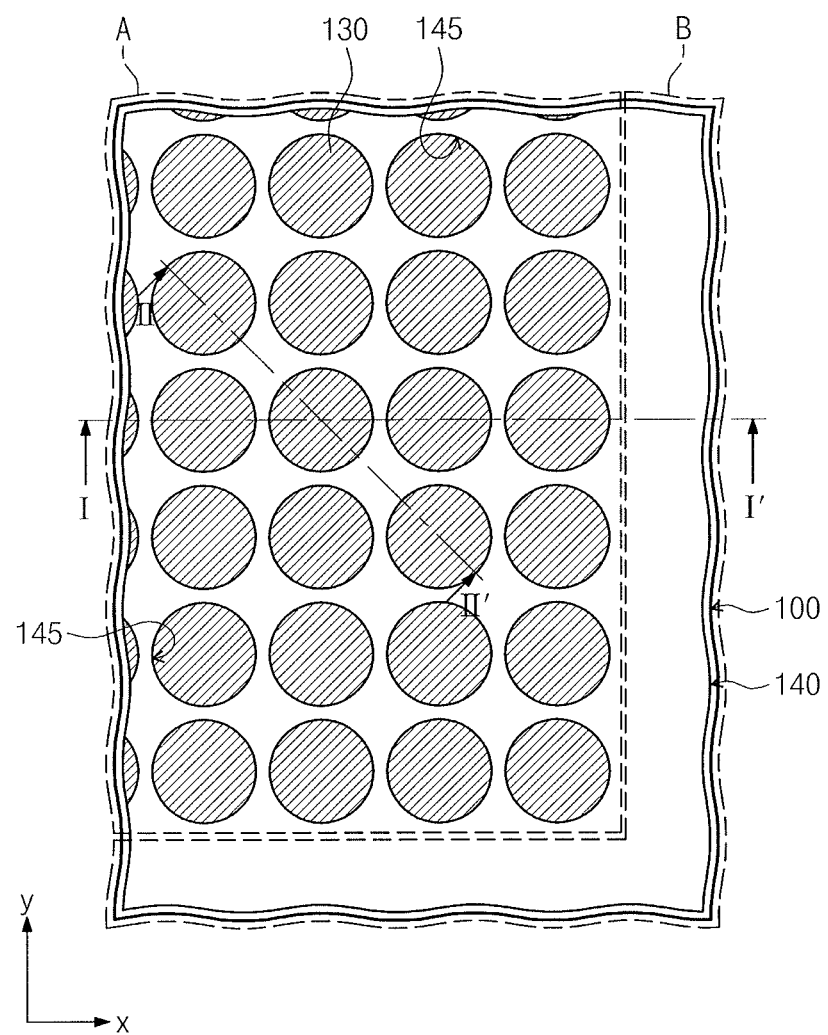
Figure 2B:
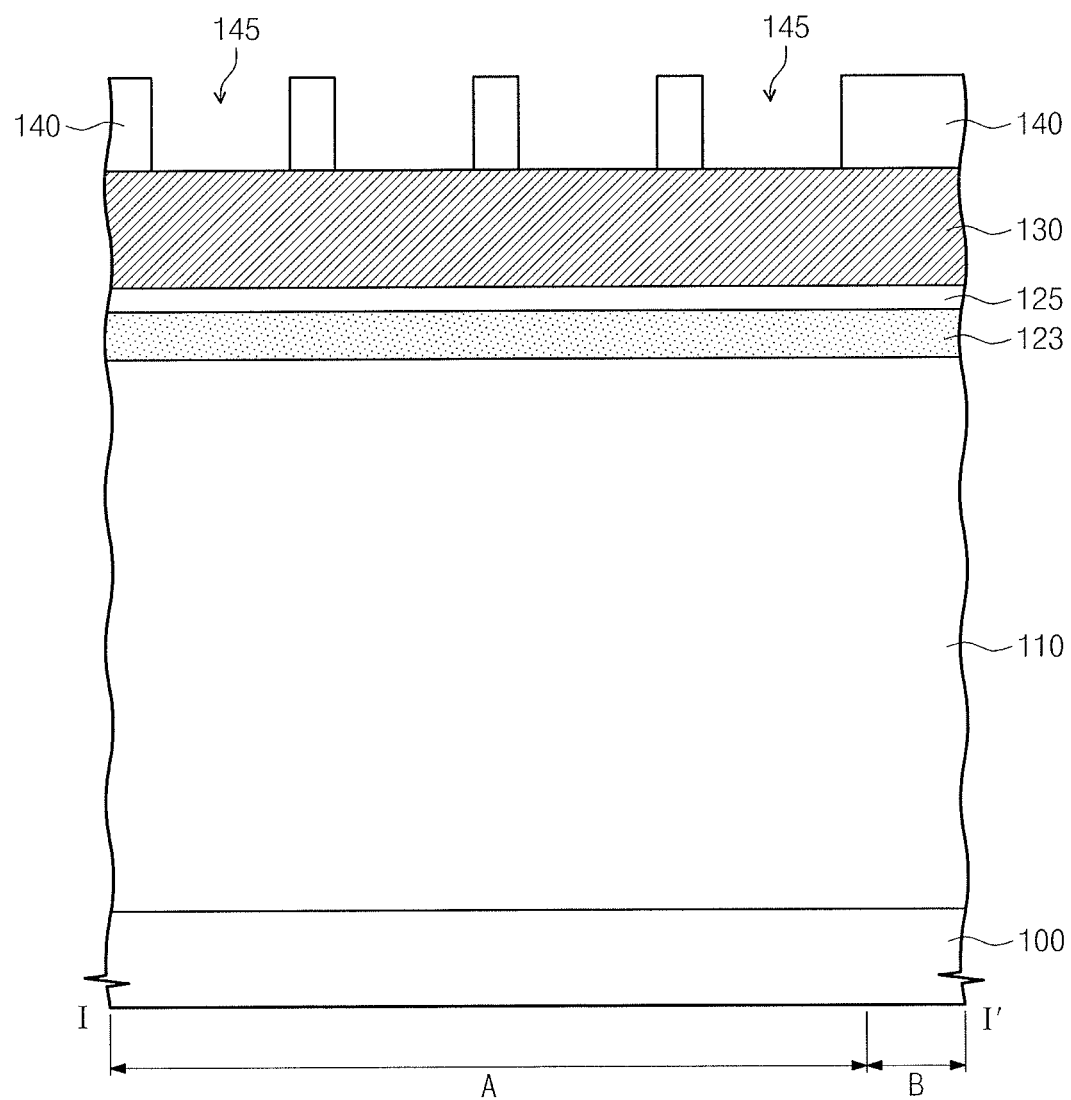
Figure 2C:
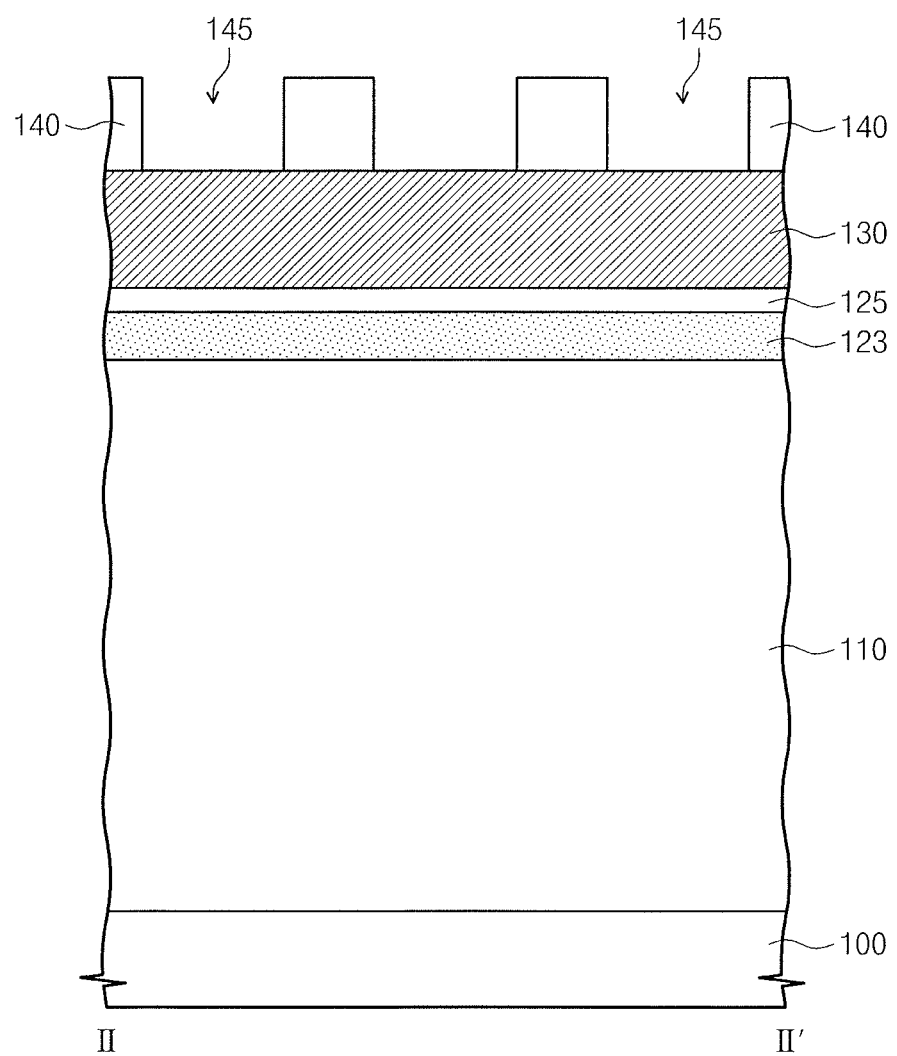

Referring to FIGS. 2A, 2B, and 2C, an isotropic etching process may be performed on the sacrificial layer 140 to enlarge the preliminary openings 145. In other words, radiuses of the preliminary openings 145 may increase by the isotropic etching process. In some embodiments, the isotropic etching process may be omitted.

Figure 3A:
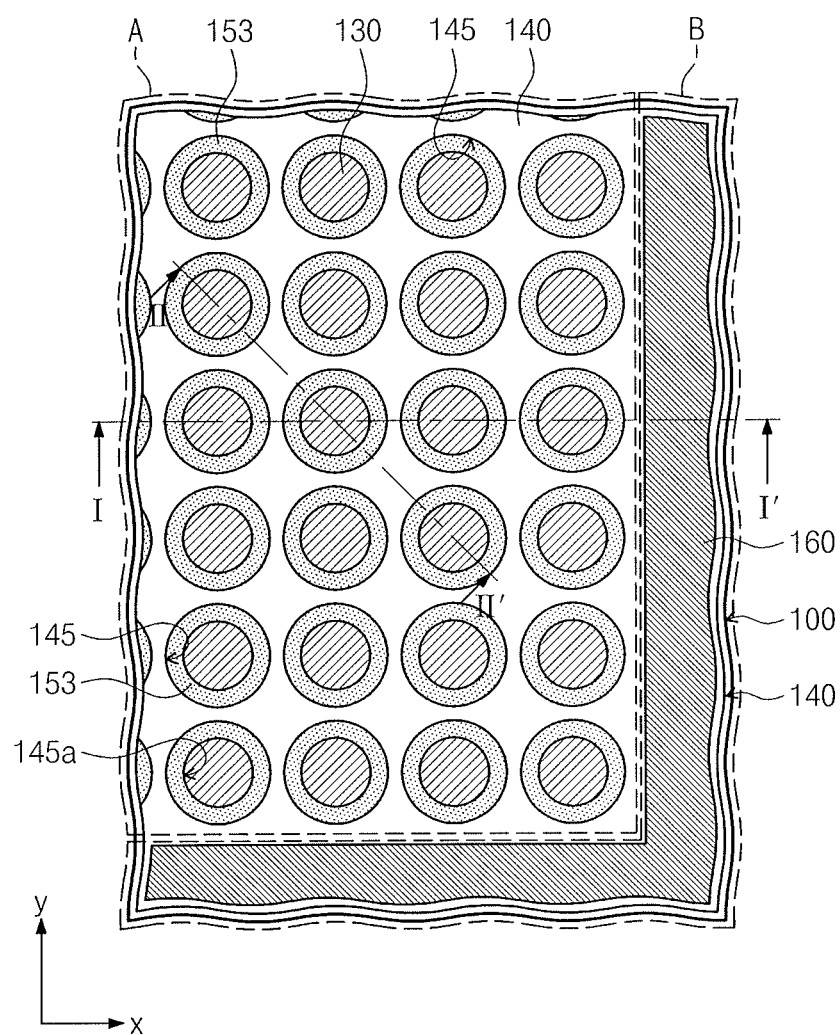
Figure 3B:
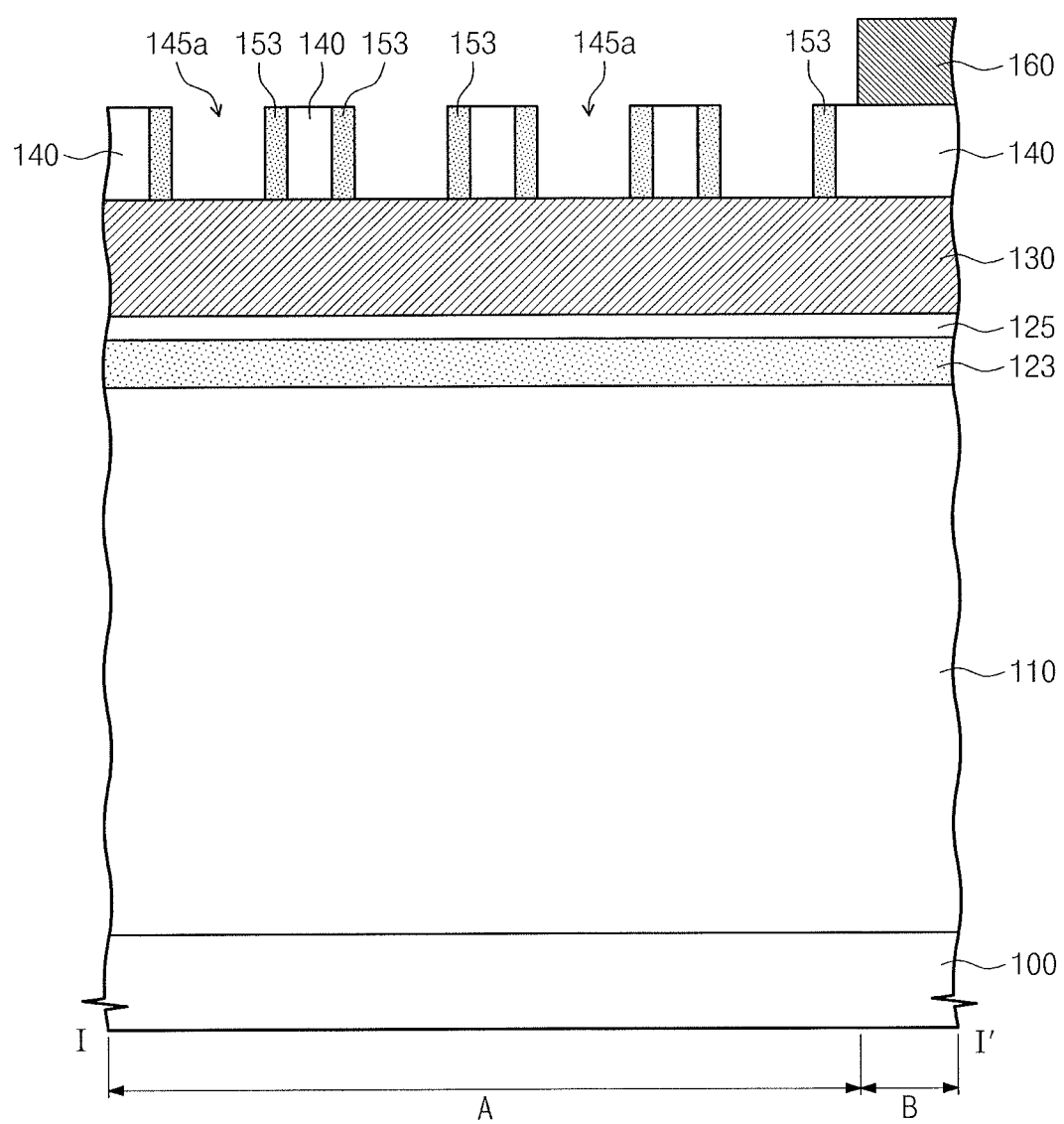
Figure 3C:
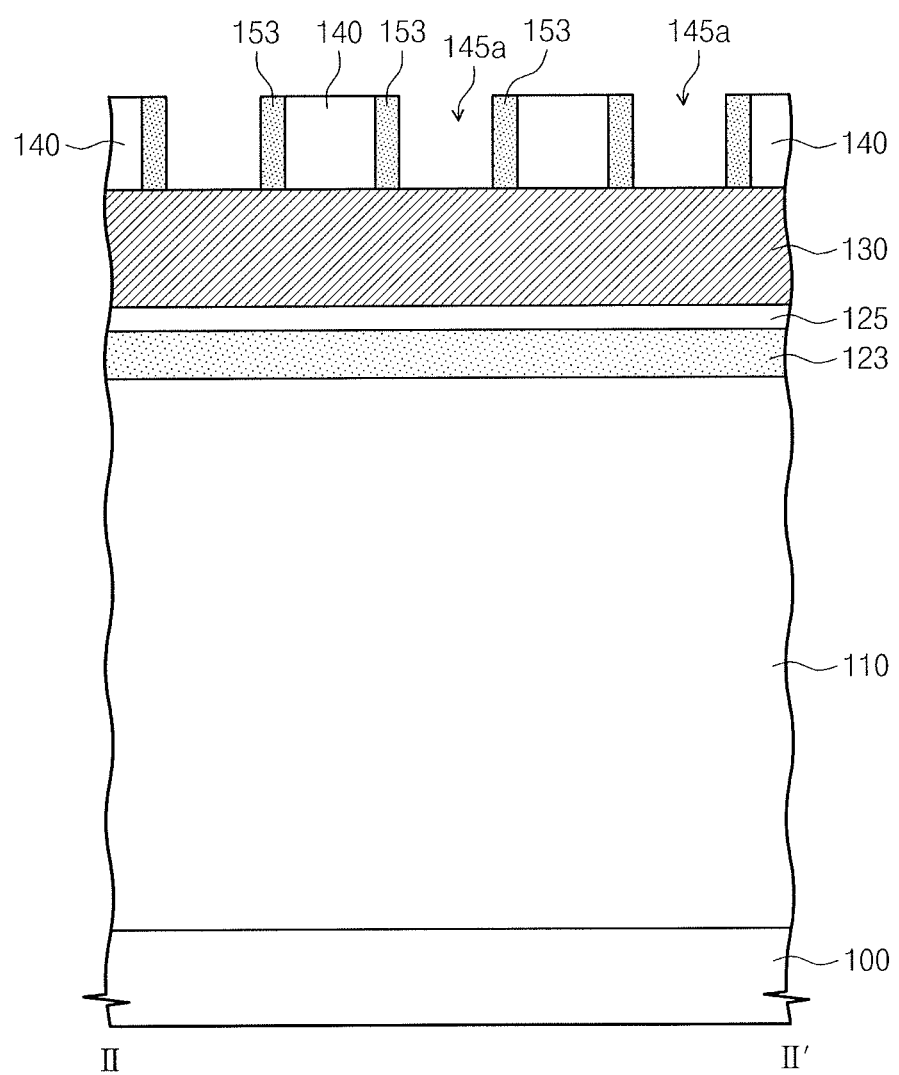

Referring to FIGS. 3A, 3B, and 3C, assistance spacers 153 may be formed in the enlarged preliminary openings 145. The assistance spacers 153 may cover inner sidewalls of the enlarged preliminary opening 145. An inner space 145a surrounded by the assistance spacer 153 may be defined in each of the enlarged preliminary openings 145. The inner spaces 145a may expose the top surface of the mask layer 130.

The assistance spacer 153 may be formed by conformally forming an assistance spacer layer on the substrate 100, and anisotropically etching the assistance spacer layer until the top surface of the mask layer 130 is exposed.

A cell open mask pattern 160 may be formed on the sacrificial layer 140 of the peripheral region B to expose the cell region A, as illustrated in FIG. 3A. The cell open mask pattern 160 may cover the sacrificial layer 140 in the peripheral region B, while the sacrificial layer 140 and the assistance spacers 153 in the cell region A may be exposed by the cell open mask pattern 160. The cell open mask pattern 160 may be formed of a material having an etch selectivity with respect to the sacrificial layer 140, the assistance spacers 153, and the mask layer 130. For example, the cell open mask pattern 160 may be formed of photoresist.

Figure 4A:
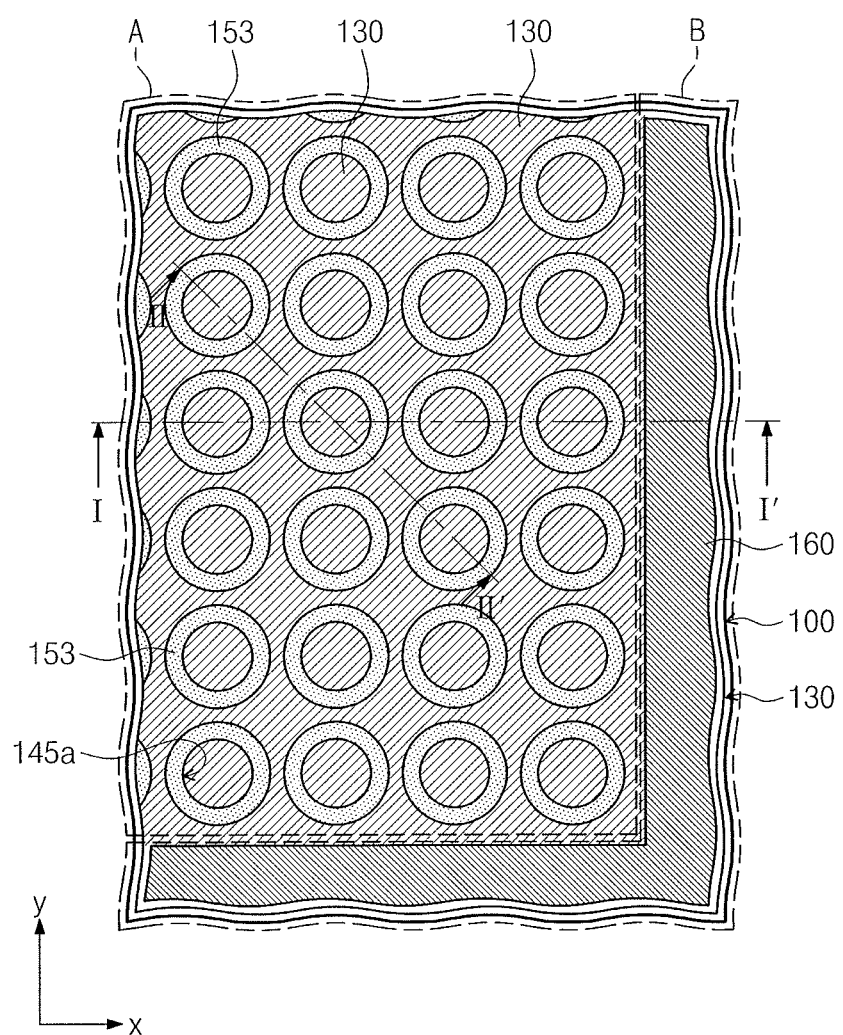
Figure 4B:
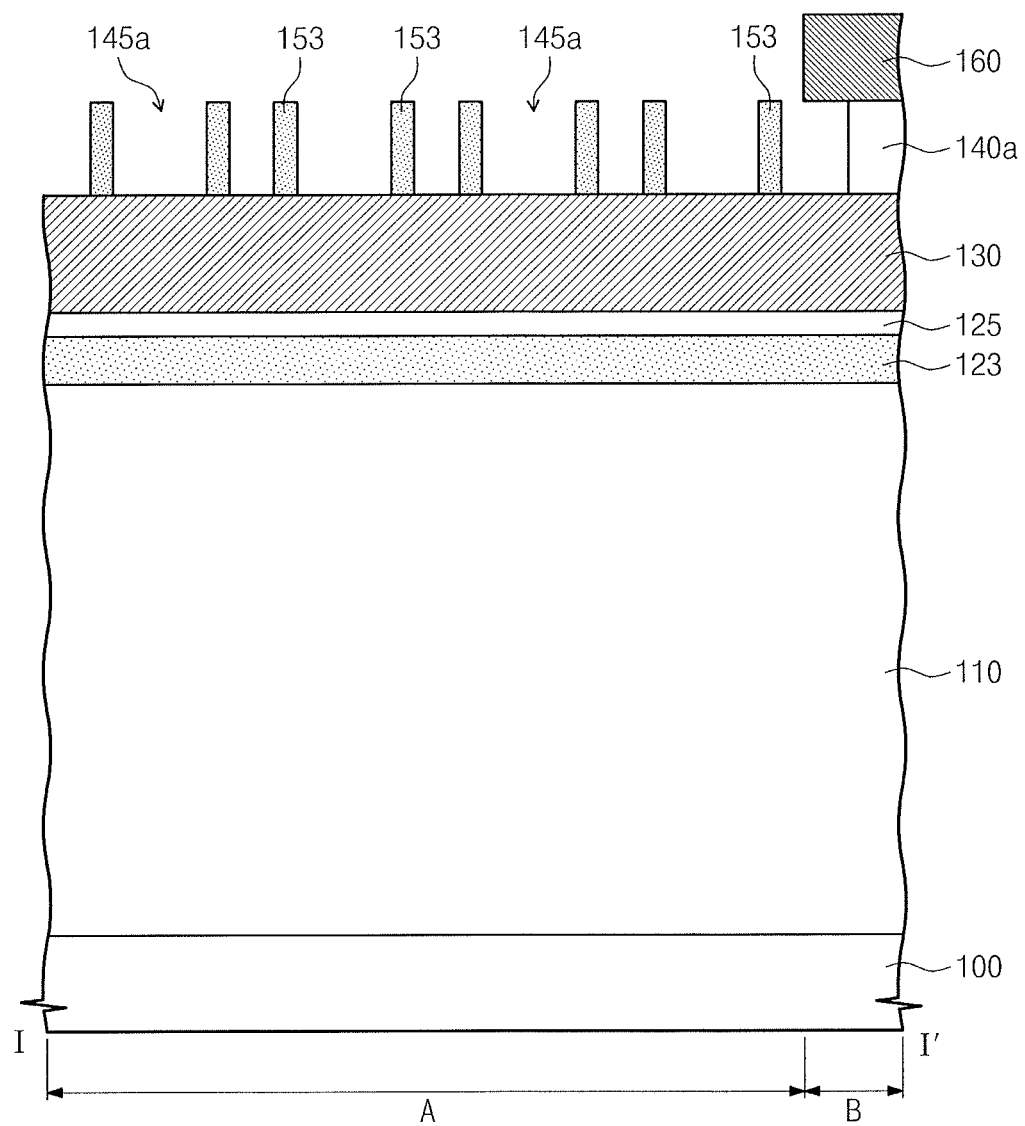
Figure 4C:
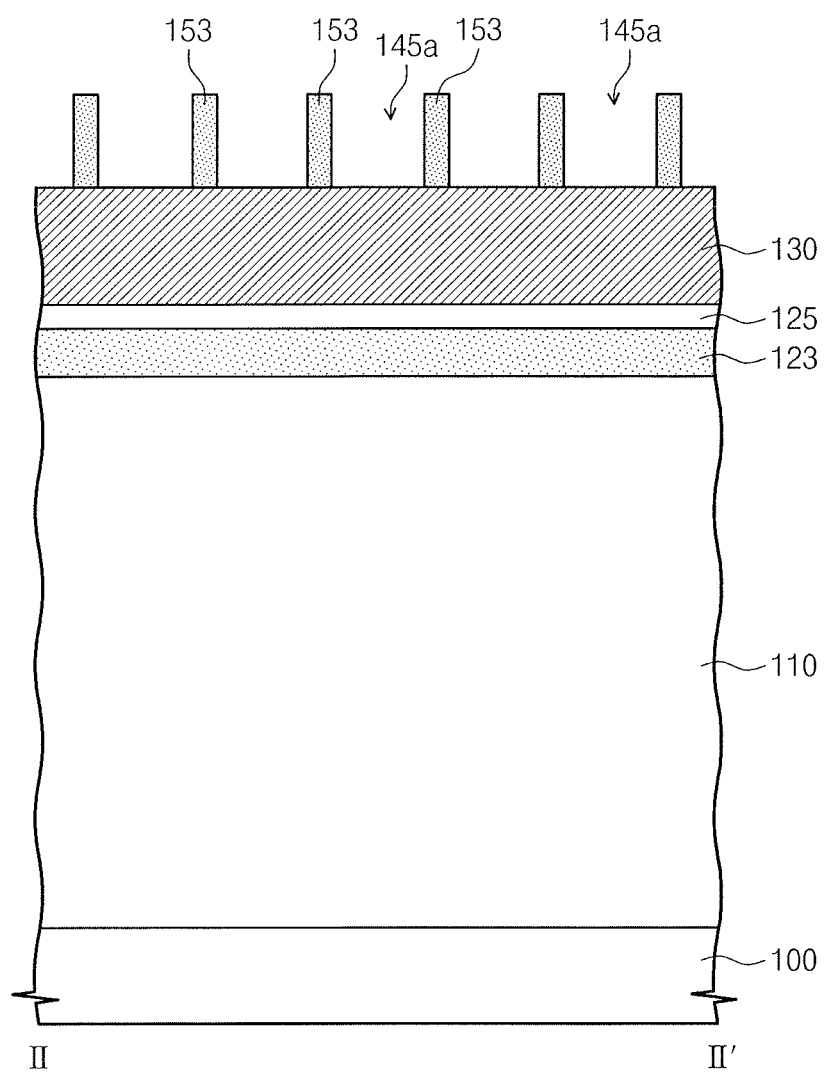

Referring to FIGS. 4A, 4B, and 4C, the sacrificial layer 140 in the cell region A may be removed, such that, e.g., only, the assistance spacers 153 remain on the mask layer 130 in the cell region A. The sacrificial layer 140 in the cell region A may be removed by an isotropic etching process using an etchant having an etch selectivity with respect to the assistance spacers 153 and the mask layer 130. In some embodiments, when the sacrificial layer 140 in the cell region A is removed, a portion of the sacrificial layer 140 in the peripheral region B adjacent the cell region A may be removed simultaneously. Since the portion of the sacrificial layer 140 in the peripheral region B is removed simultaneously with the sacrificial layer 140 of the cell region A, a peripheral sacrificial pattern 140a may be formed to expose a portion of the mask layer 130 of the peripheral region B in a boundary region between the peripheral region B and the cell region A. In other words, as illustrated in FIG. 4B, a small portion of the sacrificial layer 140 in the peripheral region B, i.e., a portion at a boundary with and in contact with the cell region A, is removed, such that the remaining portion of the sacrificial layer 140, i.e., the peripheral sacrificial pattern 140a, may remain in the peripheral region B under the cell open mask pattern 160. Therefore, the cell open mask pattern 160 may extend beyond the peripheral sacrificial pattern 140a, i.e., the cell open mask pattern 160 may overlap the peripheral sacrificial pattern 140a and a portion of the exposed mask layer 130.

Figure 5A:
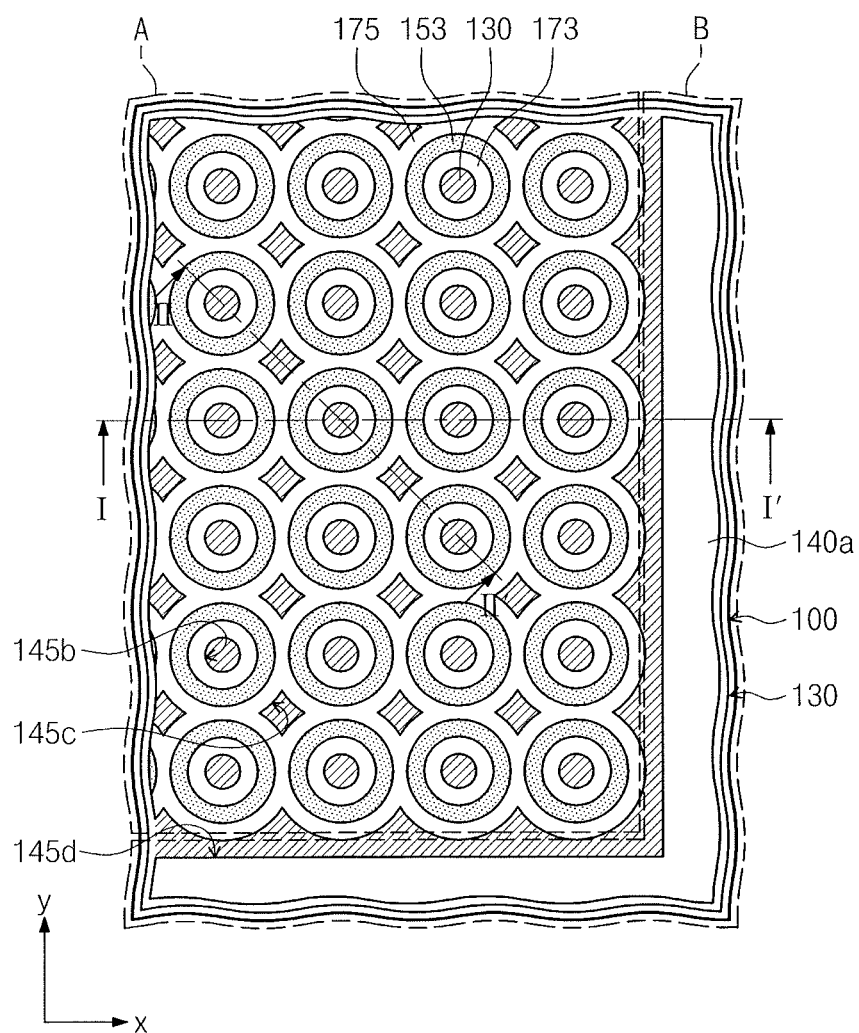
Figure 5B:
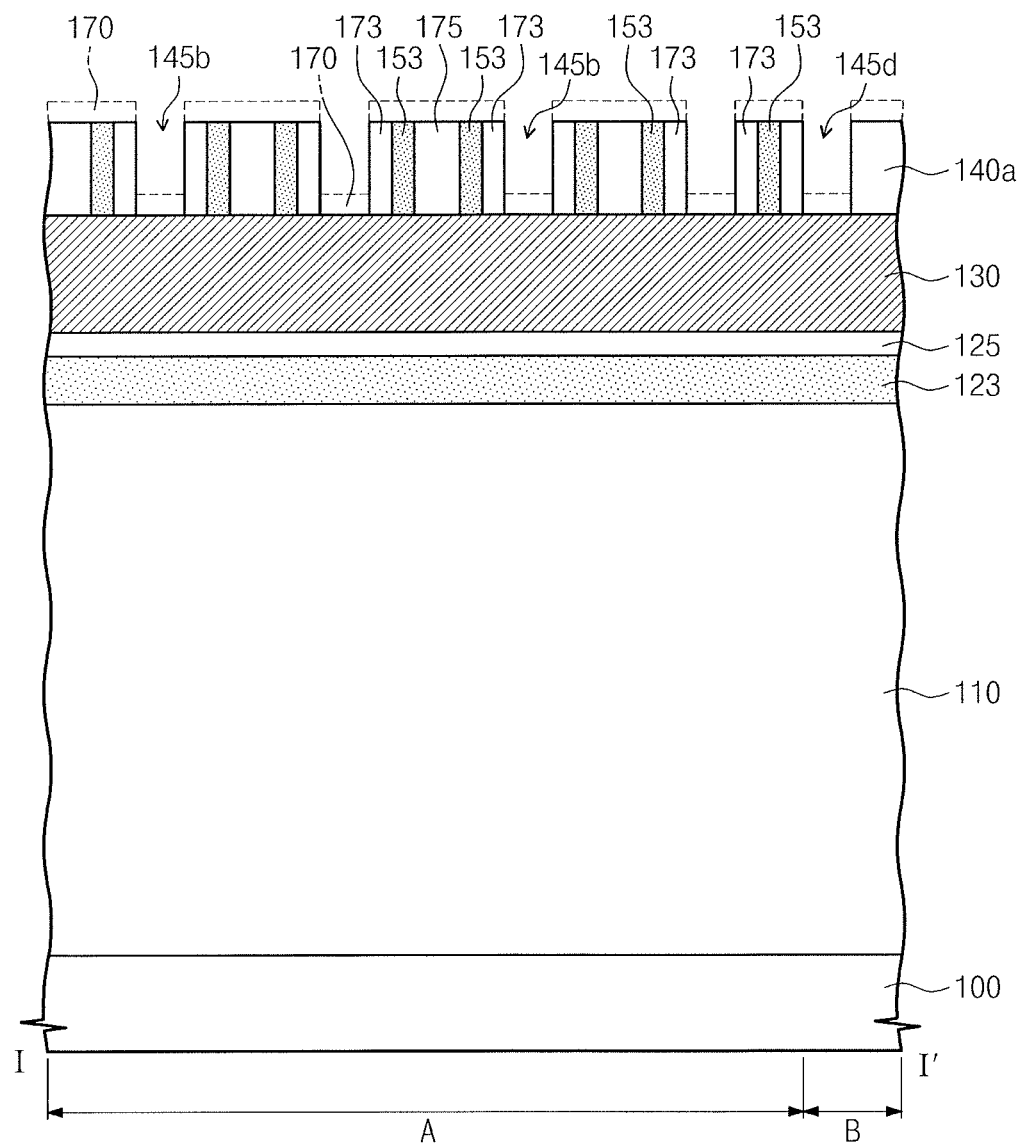
Figure 5C:
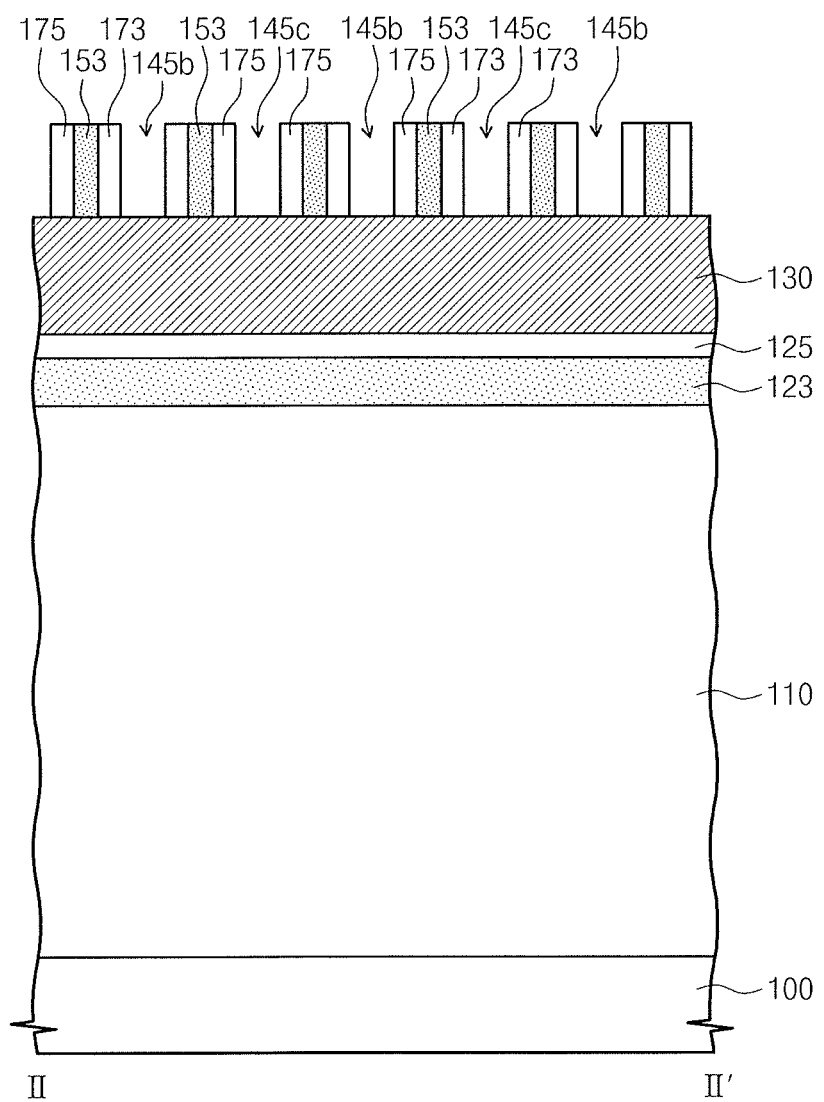

Referring to FIGS. 5A, 5B, and 5C, after removing the cell open mask pattern 160, first mask spacers 173 and a second mask spacer 175 may be formed on the mask layer 130. In detail, a mask spacer layer 170 may be conformally formed on the assistance spacers 153 and the mask layer 130. Then the mask spacer layer 170 may be anisotropically etched until the top surface of the mask layer 130 is exposed and the first mask spacers 173 and the second mask spacer 175 are formed. That is, portions of the mask spacer layer 170 on inner and outer sidewalls of the assistance spacers 153 may define the first and second mask spacers 173 and 175, respectively.

In further detail, each of the first mask spacers 173 may be formed in the inner space 145a defined by each of the assistance spacers 153. For example, each of the first mask spacers 173 may cover, e.g., continuously, an inner sidewall of each of the assistance spacers 153. A first opening 145b may be defined in each of the inner spaces 145a by each of the first mask spacers 173. For example, cylindrical assistance spacers 153 may have the first mask spacers 173 on inner sidewalls thereof, such that the first mask spacers 173 may define the first openings 145b to be concentric with the respective assistance spacers 153. In other words, the first openings 145b may be in centers of respective preliminary openings 145 and may be defined by the first mask spacers 173 to have smaller diameters than the preliminary openings 145.

The second mask spacer 175 may be formed in a space which is formed by removing the sacrificial layer 140. That is, the second mask spacer 175 may cover outer sidewalls of the assistance spacers 153, e.g., the second mask spacer 175 may be formed, e.g., continuously, between adjacent assistance spacers 153. In some embodiments, the shortest distance between a pair of the assistance spacers 153 adjacent to each other in the first direction may be less than two times a deposition thickness of the mask spacer layer formed on the mask layer 130 and the assistance spacers 153. Additionally, the shortest distance between a pair of the assistance spacers 153 adjacent to each other in the second direction may be less than two times a deposition thickness of the mask spacer layer formed on the mask layer 130 and the assistance spacers 153. Thus, a part of a space between the assistance spacers 153 adjacent to each other in the first direction may be filled with the second mask spacer 175. And a part of a space between the assistance spacers 153 adjacent to each other in the second direction may also be filled with the second mask spacer 175.

Second openings 145c exposing the top surface of the mask layer 130 may be defined by the second mask spacer 175. Each of the second openings 145c may be defined between a pair of the assistance spacers 153 adjacent to each other in a third direction when viewed from a plan view (FIG. 5A). For example, one second opening 145c may be between two assistance spacers 153 adjacent to watch other along the third direction, e.g., a diagonal direction. Therefore, the first openings 145b and the second openings 145c may be arranged to alternate in the third direction. That is, the first openings 145b and the second openings 145c may be alternately and repeatedly arranged in the third direction. The third direction may be non-parallel and non-perpendicular to the first and second directions in a plan view. In some embodiments, each of the second openings 145c may be disposed among four assistance spacers 153 adjacent to each other when viewed from a plan view, e.g., one second opening 145c may be disposed in a center of a square having its vertices defines by the first openings 145b of respective four assistance spacers 153.

A mask trench 145d exposing the mask layer 130 may be formed in the boundary region between the cell region A and the peripheral region B. The mask trench 145d may be defined by the second mask spacer 175 and the peripheral sacrificial pattern 140a.

Figure 6A:
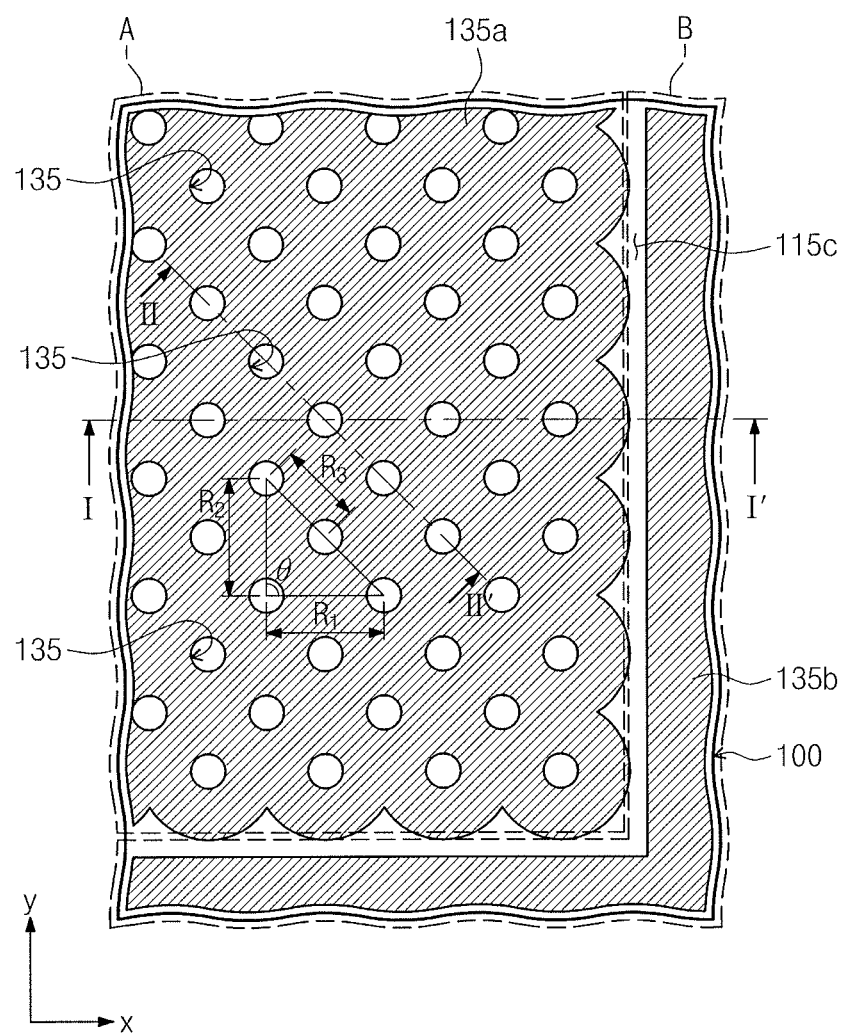
Figure 6B:
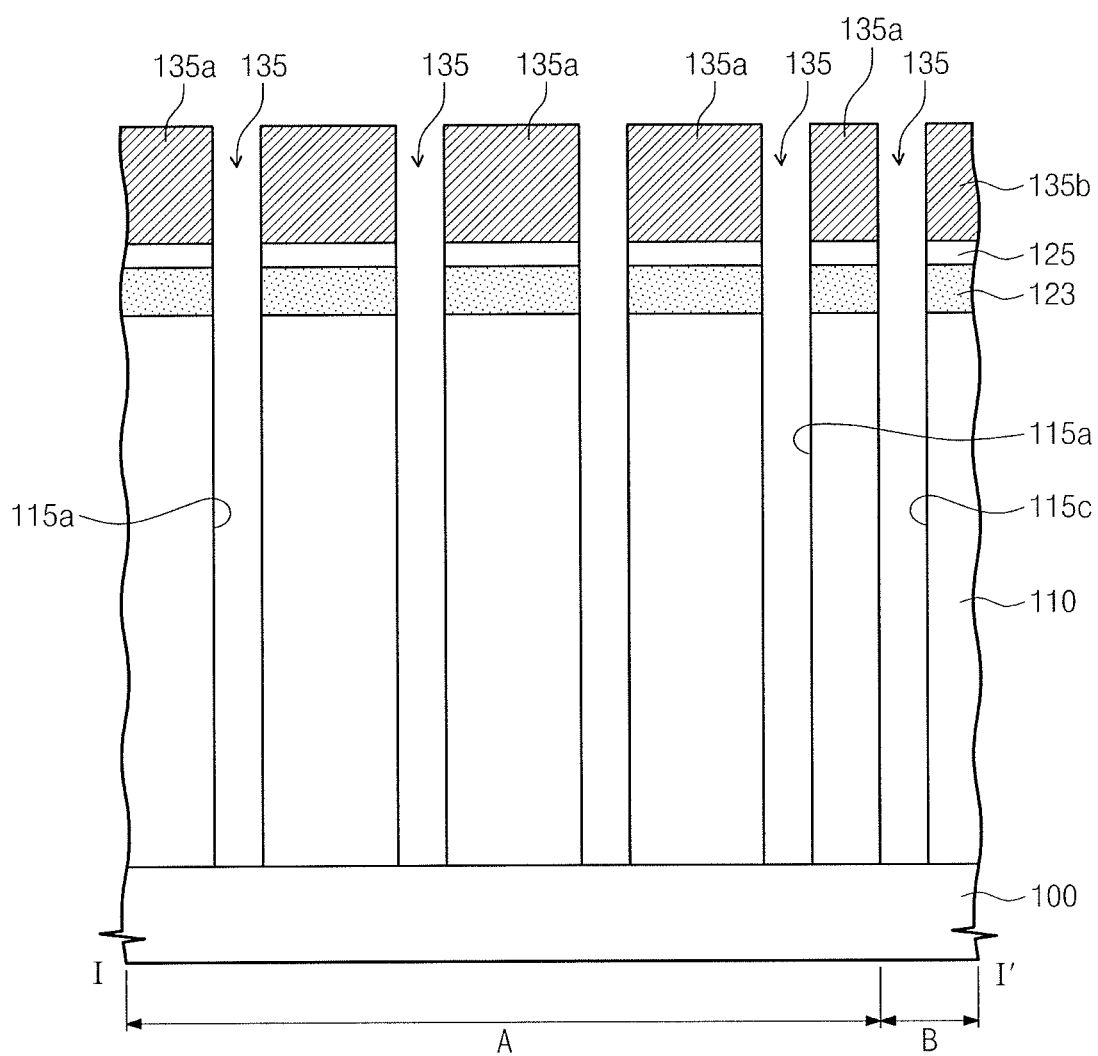
Figure 6C:
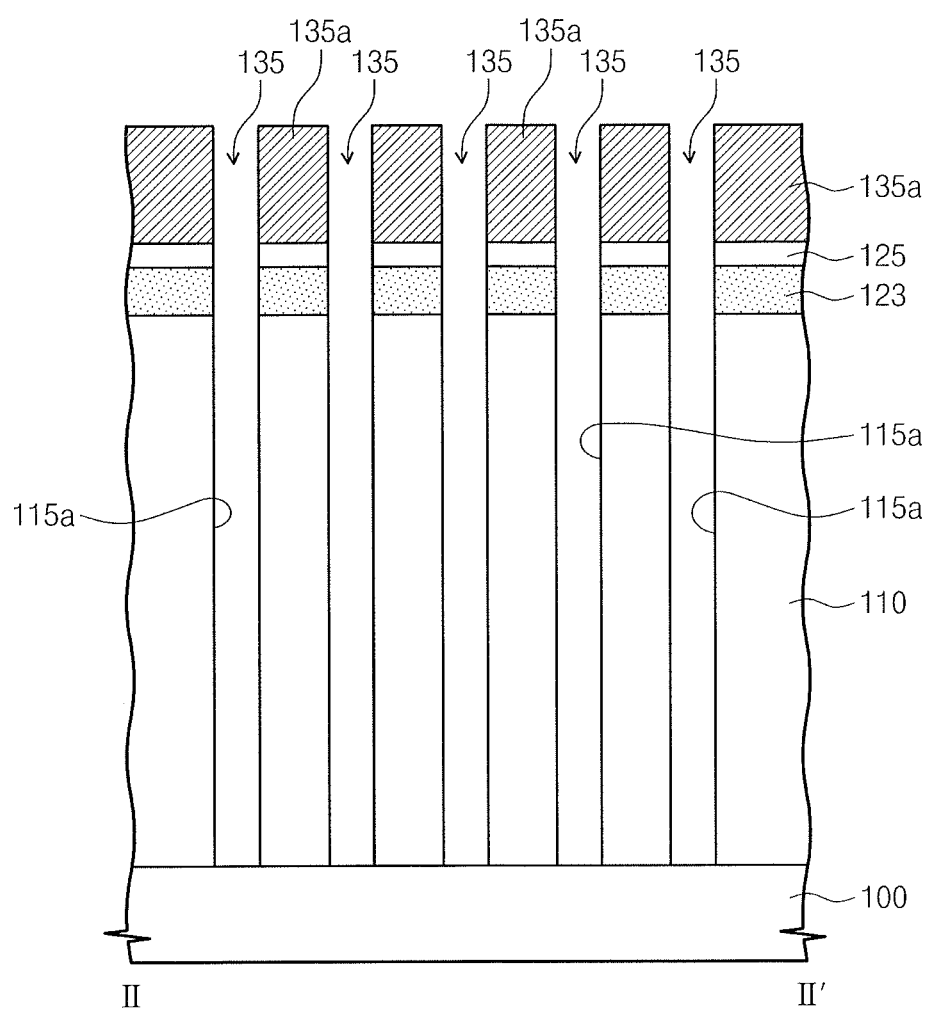

Referring to FIGS. 6A, 6B, and 6C, the mask layer 130 may be etched to form a cell mask pattern 135a and a peripheral mask pattern 135b. The cell mask pattern 135a and the peripheral mask pattern 135b may be formed by an anisotropic etching process using the assistance spacers 153, the first mask spacers 173, the second mask spacer 175, and the peripheral sacrificial pattern 140a as etch masks. The mask layer 130 may be divided into the cell mask pattern 135a and the peripheral mask pattern 135b by etching the mask layer 130 exposed by the mask trench 145d.

The cell mask pattern 135a may have a plurality of mask holes 135 defined by the first openings 145b and the second opening 145c. In other words, portions of the mask layers exposed by the first openings 145b and the second openings 145c may be etched to form the mask holes 135 exposing the buffer oxide layer 125.

In some embodiments, the second openings 145c may have a polygon shape having vertices in a plan view. In this case, the amount of an etchant provided to a vertex region in the second opening 145c may be less than the amount of the etchant provided to the other region in the second opening 145c. In other words, when the mask layer 130 is etched, an etch rate of a portion of the mask layer 130 exposed by the vertex region of the second opening 145c may be less than an etch rate of a portion of the mask layer 130 exposed by the other region of the second opening 145c. Thus, the mask holes 135 defined by the second openings 145c may be formed to have circular shapes in a plan view.

The buffer oxide layer 125, the supporting layer 123, and the mold layer 110 may be successively etched using the cell mask pattern 135a and the peripheral mask pattern 135b as etch masks. Thus, a plurality of holes 115a may be formed in the mold layer 110 in the cell region A. The holes 115a may expose the substrate 100.

As illustrated in FIG. 6A, a distance between center points of a pair of the holes 115a adjacent to each other in the first direction is represented as $R_1$, a distance between center points of a pair of three holes 115a adjacent to each other in the second direction is represented as $R_2$, and a distance between center points of a pair of the holes 115a adjacent to each other in the third direction is represented as $R_3$. A designator 'θ' represents an angle between a straight line connecting the center points of the pair of the holes 115a adjacent to each other in the first direction and a straight line connecting the center points of the pair of the holes 115a adjacent to each other in the second direction. In some embodiments, the angle θ may be 90 degrees. In this case, the $R_3$ may be represented as the following formula 1.

$$R_3=((R_1^2+R_2^2)/4)^{1/2} \quad \text{[Formula 1]}$$

In some embodiments, the $R_1$ may be equal to the $R_2$. In this case, the $R_3$ may be $R_1/(2^{1/2})$.

When the holes 115a are formed, the mold 110 in the boundary region between the cell region A and the peripheral region B may be etched to form a dummy trench 115c. The dummy trench 115c may expose the substrate 100. The mold layer 110 in the peripheral region B may be separated from the mold layer 110 in the cell region A by the dummy trench 115c.

Figure 7A:
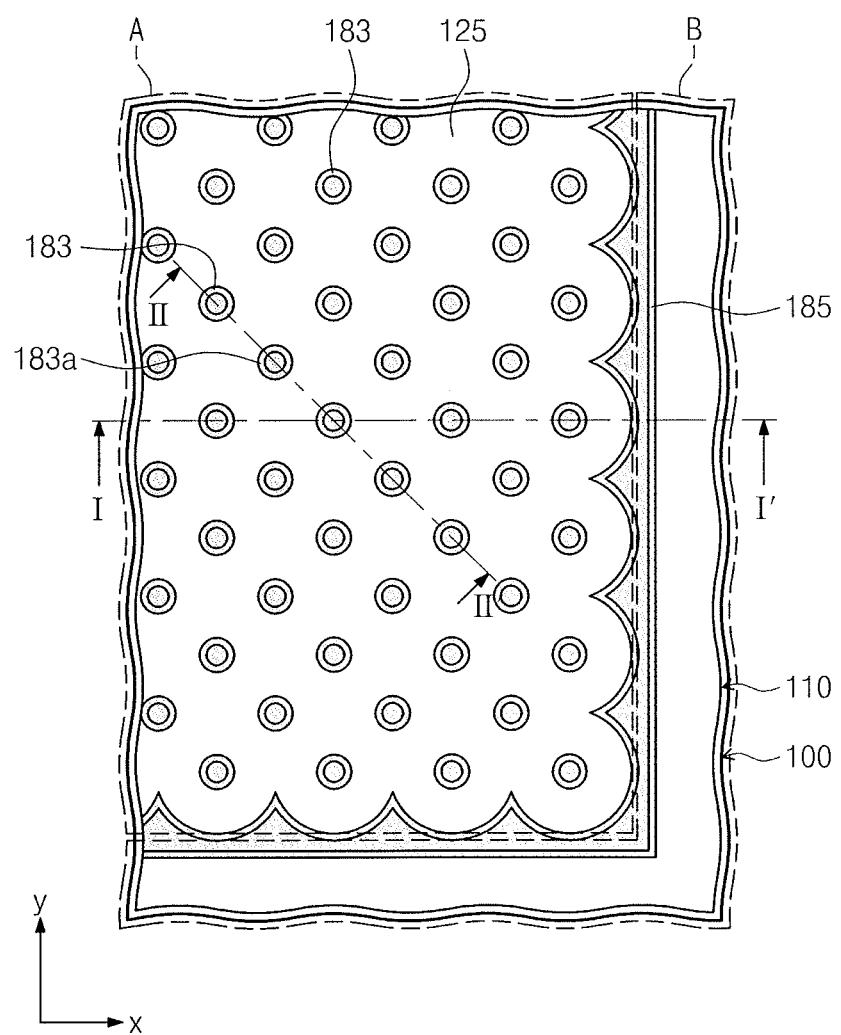
Figure 7B:
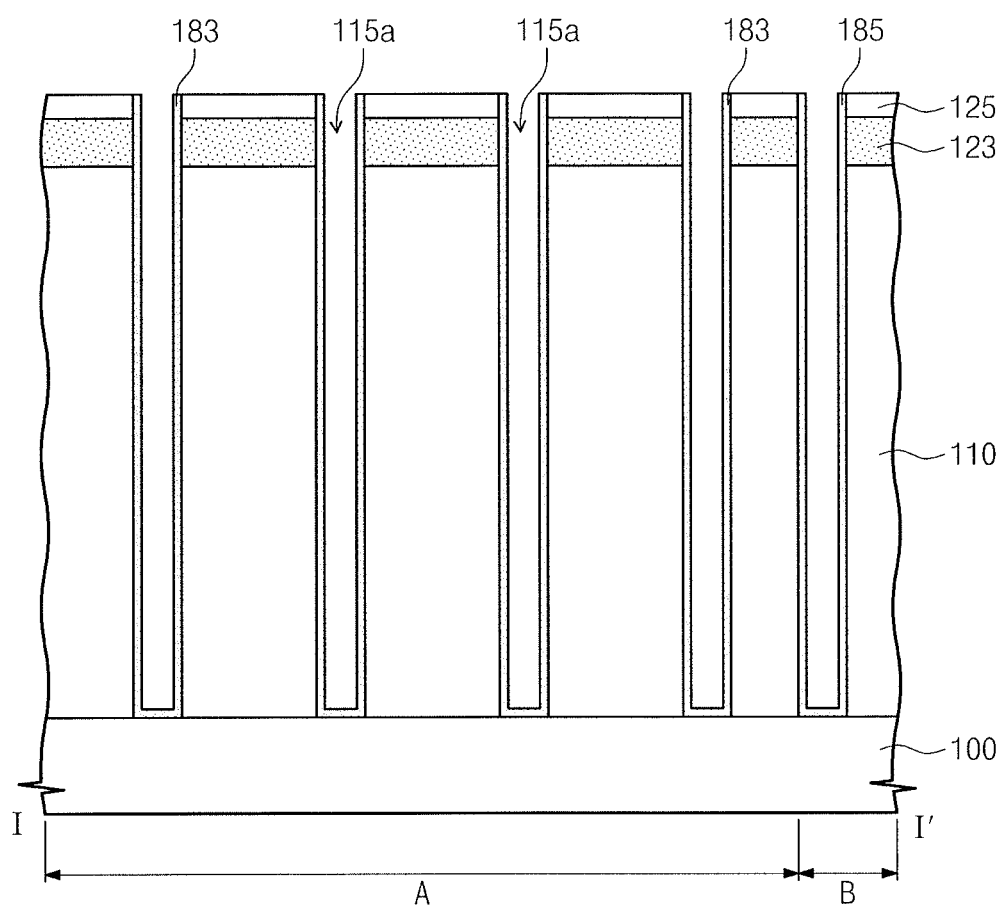
Figure 7C:
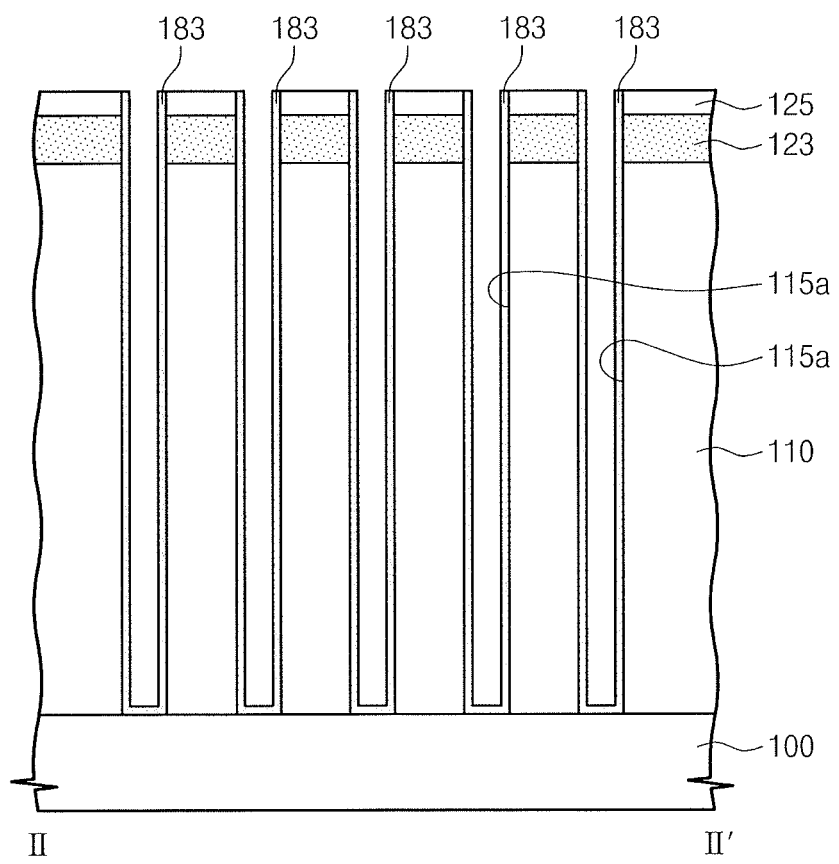

Referring to FIGS. 7A, 7B, and 7C, first electrodes 183 may be formed in the holes 115a, respectively. Additionally, a dummy pattern 185 may be formed in the dummy trench 115c. A first electrode layer may be conformally formed on the substrate 100 having the holes 115a, and then the first electrode layer may be etched until the buffer oxide layer 125 is exposed. Thus, the first electrodes 183 and the dummy pattern 185 may be formed. In some embodiments, the first electrode layer may be formed by using a PVD process, a CVD process, and/or an atomic layer deposition (ALD) process.

In other embodiments, each of the first electrodes 183 may completely fill each of the holes 115a. In other words, the first electrode 183 may have a pillar shape. Additionally, the dummy pattern 185 may also completely fill the dummy trench 115c.

The first electrodes 183 and the dummy pattern 185 may include at least one of a doped semiconductor, a conductive metal nitride (e.g., titanium nitride, tantalum nitride, and/or tungsten nitride, etc.), metal (e.g., ruthenium, iridium, titanium, and/or tantalum, etc.), and a conductive metal oxide (e.g., iridium oxide, etc.).

Figure 8A:
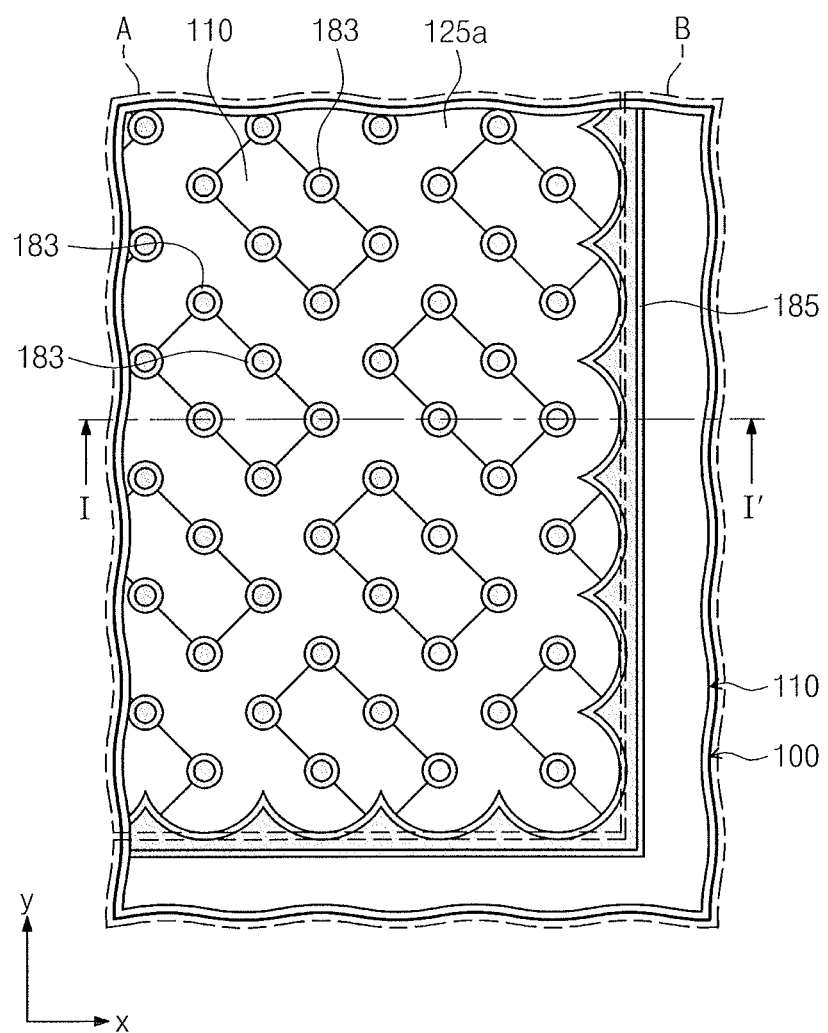
Figure 8B:
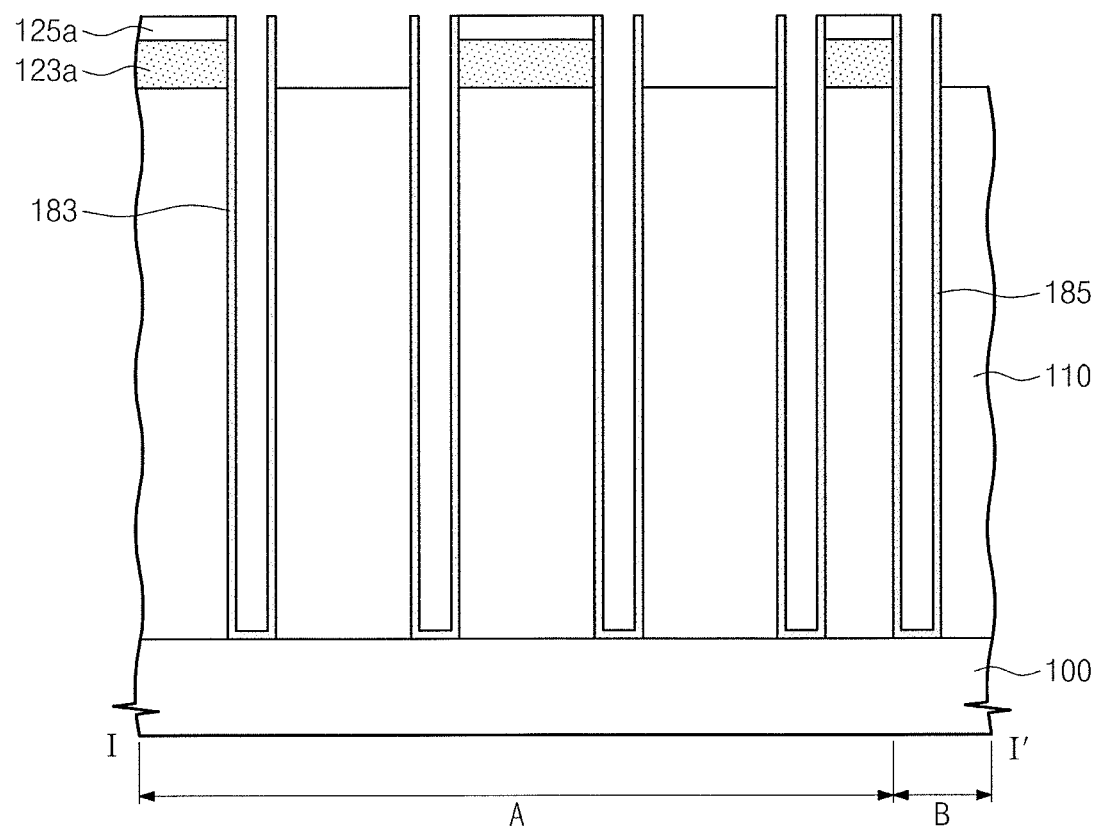

Referring to FIGS. 8A and 8B, the buffer oxide layer 125 and the supporting layer 123 may be patterned to form a supporting pattern 123a and a buffer oxide pattern 125a. The supporting pattern 123a and the buffer oxide pattern 125a may expose portions of a top surface of the mold layer 110. For example, as illustrated in FIG. 8A, portions of the buffer oxide layer 125 and supporting layer 123 may be removed to expose, e.g., rectangular, regions of the mold layer 110 among a plurality of the first electrodes 183. For example, a plurality, e.g., six, of the first electrodes 183 may be arranged along a perimeter of the exposed region of the mold layer 110, such that each first electrode 183 may be between the exposed region of the mold layer 110 and the remaining portion of the buffer oxide layer, i.e., the buffer oxide pattern 125a. The supporting pattern 123a may be in contact with at least a portion of each of the first electrodes 183. The supporting pattern 123a may function to support the first electrodes 183. In other words, the supporting pattern 123a may prevent the first electrodes 183 having a high aspect ratio from being electrically connected to each other by contact or lifting.

Figure 9A:
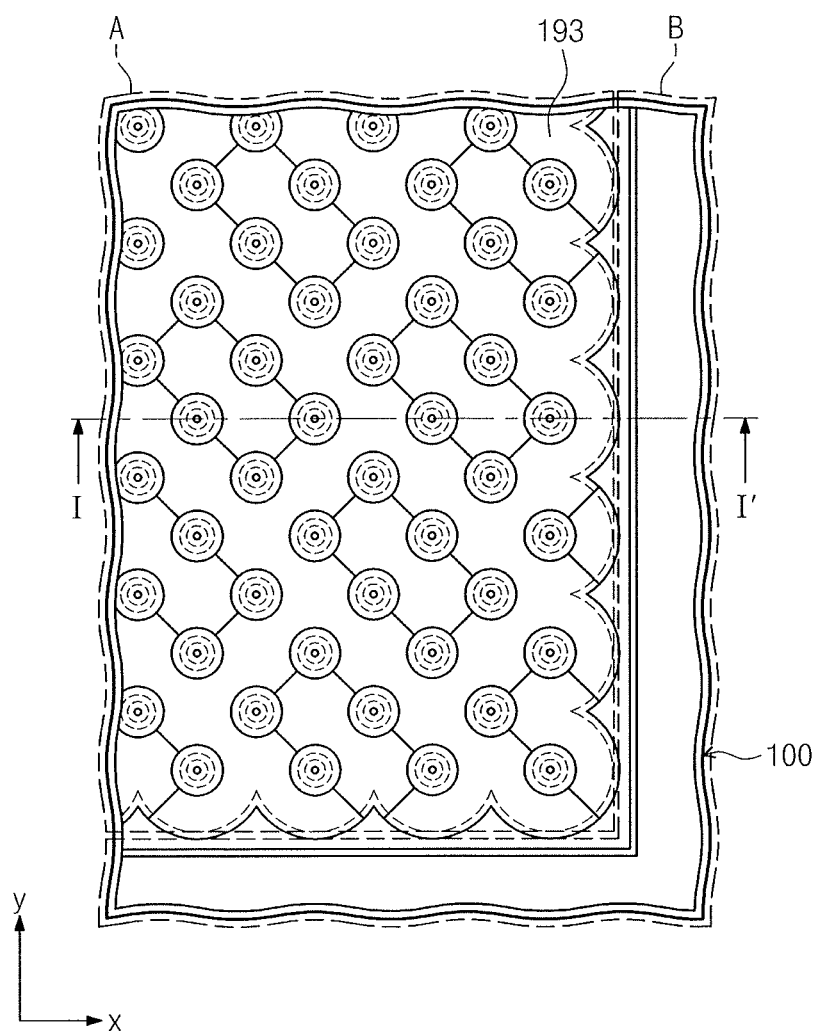
Figure 9B:
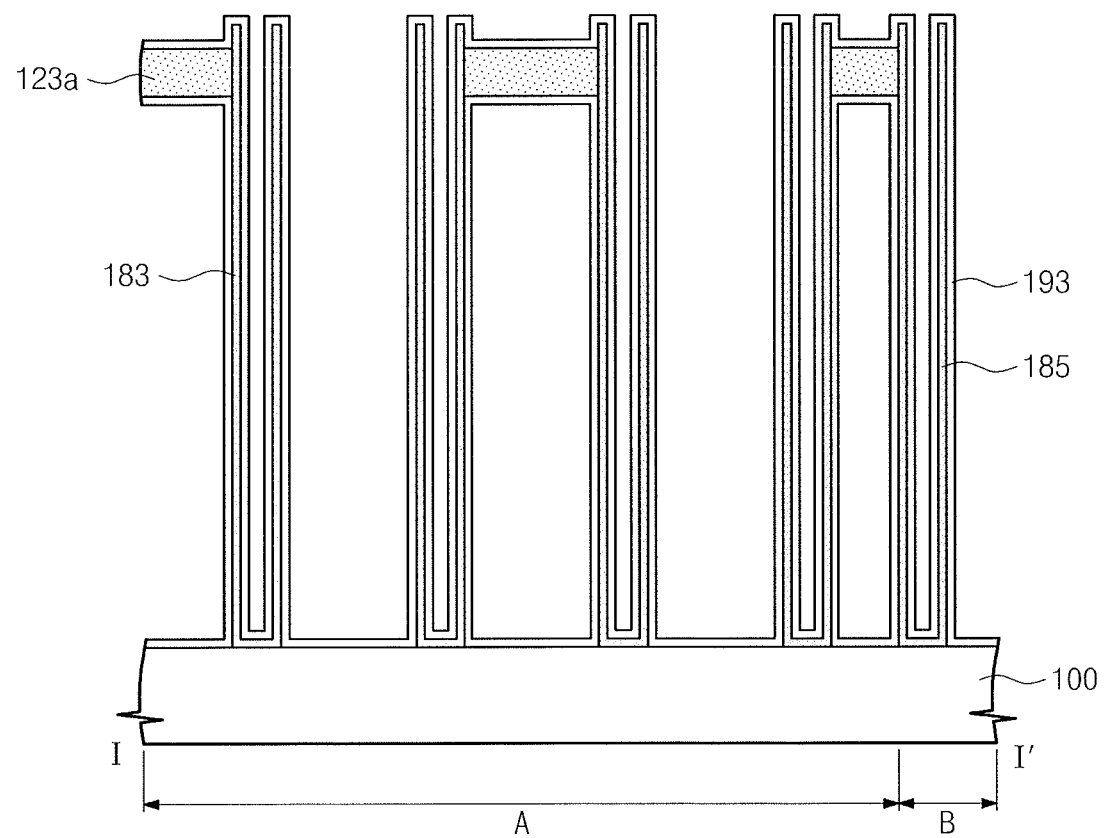

Referring to FIGS. 9A and 9B, the buffer oxide pattern 125a and the mold layer 110 in the cell and peripheral regions A and B may be removed. Outer sidewalls of the first electrodes 183 may be exposed by removing the buffer oxide pattern 125a and the mold layer 110. In some embodiments, the buffer oxide pattern 125a and the mold layer 110 may be removed by an isotropic etching process using an etchant having an etch selectivity with respect to the supporting pattern 123a. For example, the mold layer 110 may be removed by a LAL lift-off process using a LAL solution including ammonium fluoride ($NH_4F$), hydrofluoric acid (HF), and water.

In other embodiments, the mold layer 110 of the cell region A may be removed but the mold layer of the peripheral region B may not be removed. In other words, if an etch preventing mask pattern is formed on the mold layer 110 of the peripheral region B, the mold layer 110 of the peripheral region B may remain, and the mold layer 110 of the cell region A may be removed. In the present embodiment, the dummy pattern 185 may function as a barrier preventing the etchant for removal of the mold layer 110 of the cell region A from etching the mold layer 110 of the peripheral region B. According to the present embodiment, since a step difference between the cell region A and the peripheral region B may be reduced by the remaining mold layer 110 of the peripheral region B, it is possible to minimize defects caused by the step difference between the cell and peripheral regions A and B.

After the mold layer 110 is removed, a capacitor dielectric layer 193 may be conformally formed on the substrate 100. The capacitor dielectric layer 193 may be conformally formed along outer sidewalls, top surfaces, and inner surfaces of the first electrodes 183, a surface of the supporting pattern 123a, and the top surface of the substrate 100. The capacitor dielectric layer 193 may include at least one of an oxide layer (e.g., a silicon oxide layer), a nitride layer (e.g., a silicon nitride layer), an oxynitride layer (e.g., a silicon oxynitride layer), and a high-k dielectric layer (e.g., a metal oxide layer such as a hafnium oxide layer and/or an aluminum oxide layer).

Figure 10A:
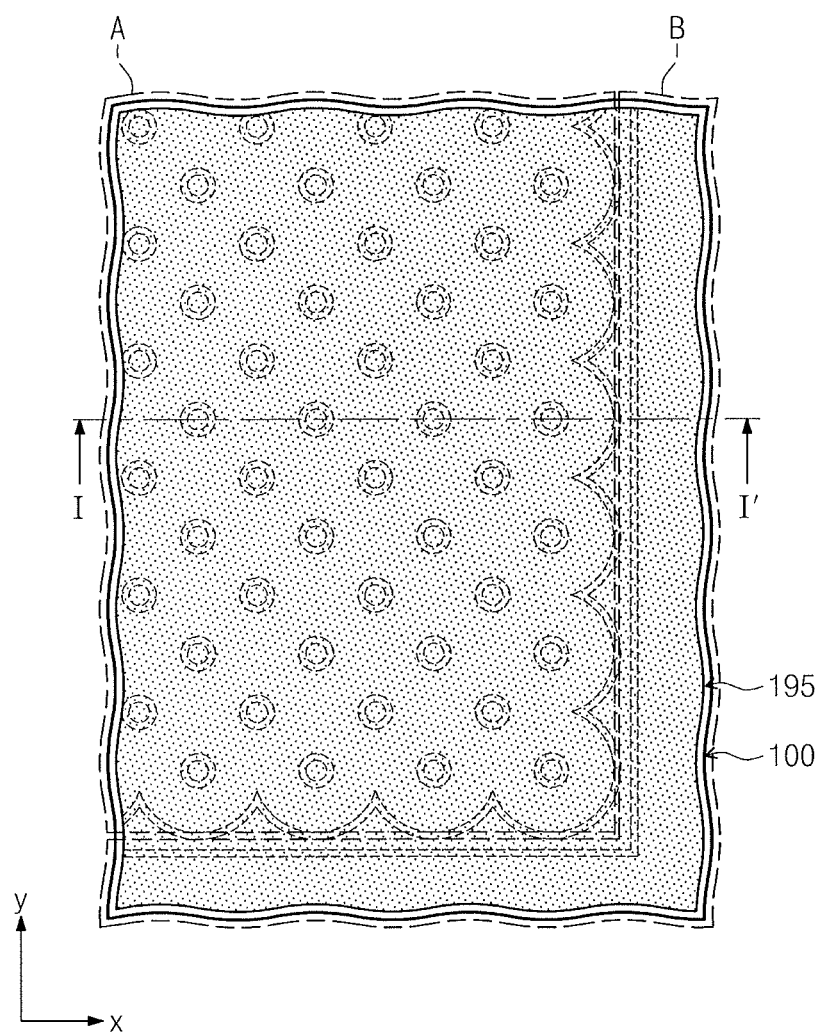
Figure 10B:
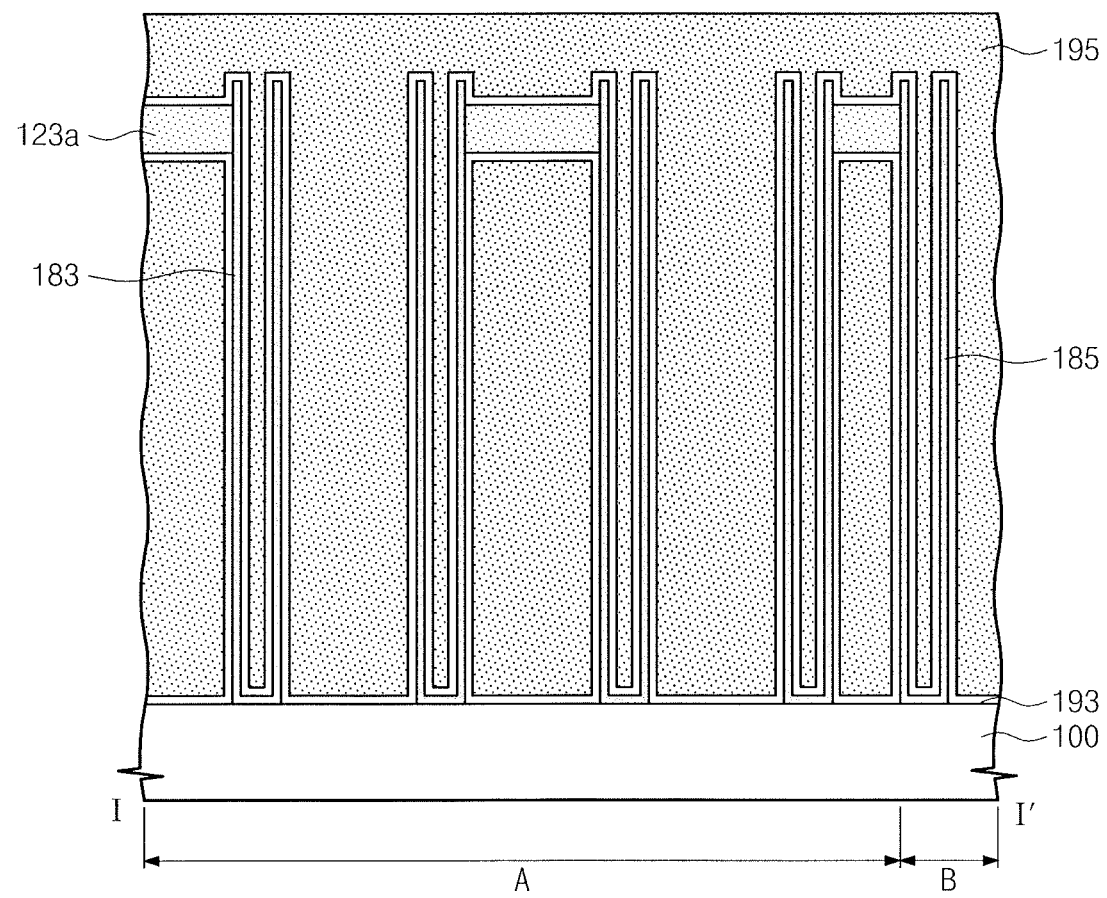

Referring to FIGS. 10A and 10B, a second electrode layer 195 may be formed on the substrate 100. The second electrode layer 195 may fill a space formed by removal of the mold layer 110 and inner spaces surrounded by the inner surfaces of the first electrodes 183. Thus, the capacitor dielectric layer 193 may be disposed between the second electrode layer 195 and the first electrodes 183 and between the second electrode layer 195 and the supporting pattern 123a. The second electrode layer 195 may include at least one of a doped semiconductor layer, a conductive metal nitride layer (e.g., a titanium nitride layer, tantalum nitride layer, and/or tungsten nitride layer, etc.), a metal layer (e.g., a ruthenium layer, an iridium layer, a titanium layer, and/or tantalum layer, etc.), and a conductive oxide layer (e.g., an iridium oxide layer, etc.).

According to an embodiment of the inventive concept described above, the first openings 145b defined by the first mask spacers 173 and the second openings 145c defined by the second mask spacer 175 may be formed on the mask layer 130 using the assistance spacers 153 for the formation of the holes 115a. In other words, the first openings 145b may be defined using the preliminary openings 145 defined by one photolithography process, the assistance spacers 153, and the first mask spacers 173, and the second openings 145c may be defined between the first openings 145b in the third direction by the second mask spacer 175. Therefore, formation of the second openings 145c between the first openings 145b in the third direction minimizes a distance between adjacent holes, thereby reducing a minimal distance defined by lithography equipment.

In contrast, when holes are formed only using lithography equipment, e.g., if holes were formed only via the first openings 145b without the second openings 145c, it may be difficult to reduce a distance between adjacent holes due to physical limitation of the lithography equipment. However, according to embodiments of the inventive concept, since the second openings 145c are defined between the first openings 145b in the third direction by the assistance spacers 153 and the second mask spacer 175, it is possible to form the holes 115a having intervals shorter than a minimum distance defined by the lithography equipment. Thus, it is possible to realize a semiconductor memory device with higher integration. Additionally, since the usage of high cost lithography equipments may be decreased in a method of manufacturing a semiconductor memory device, it is possible to reduce a manufacturing cost of the semiconductor memory device.

Hereinafter, a method of forming a semiconductor memory device according to another embodiment of the inventive concept will be described in more detail with reference to the drawings. FIGS. 11A to 15A are plan views illustrating stages in a method of forming a semiconductor memory device according to another embodiment of the inventive concept, and FIGS. 11B to 15B are cross-sectional views taken along lines I-I' of FIGS. 11A to 15A, respectively.

The method according to the present embodiment may include all processes described with reference to FIGS. 1A to 1C and 2A to 2C.

Figure 11A:
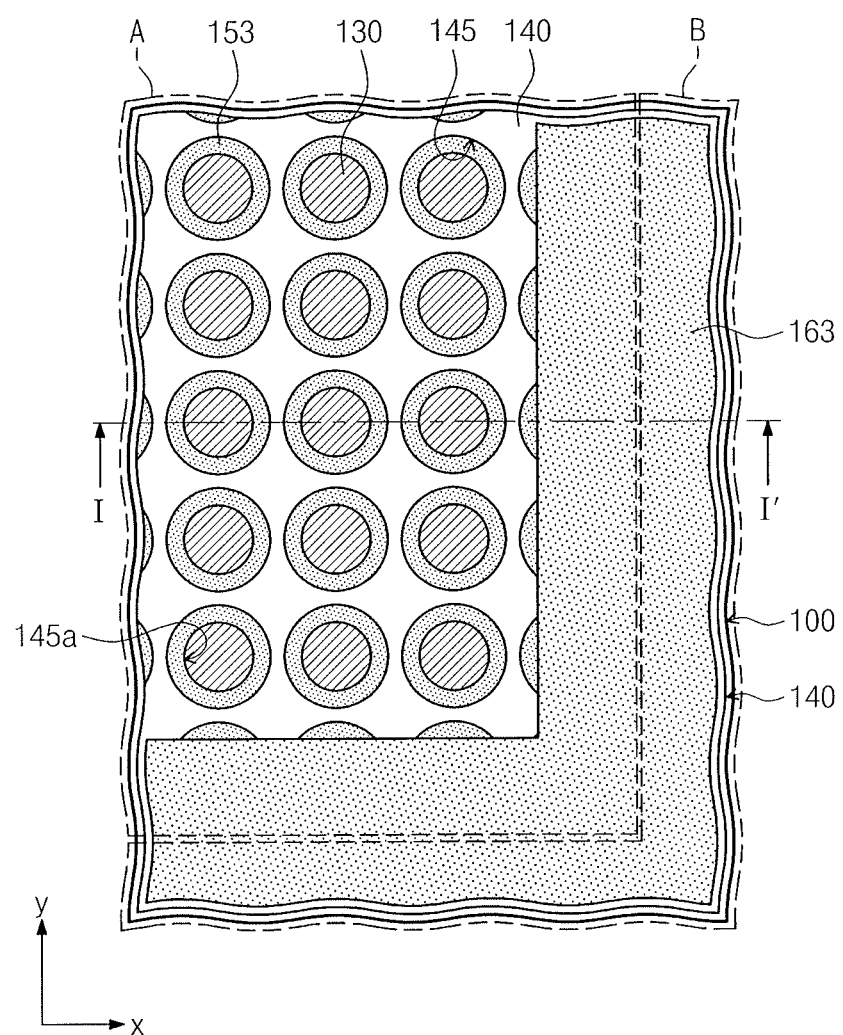
Figure 11B:
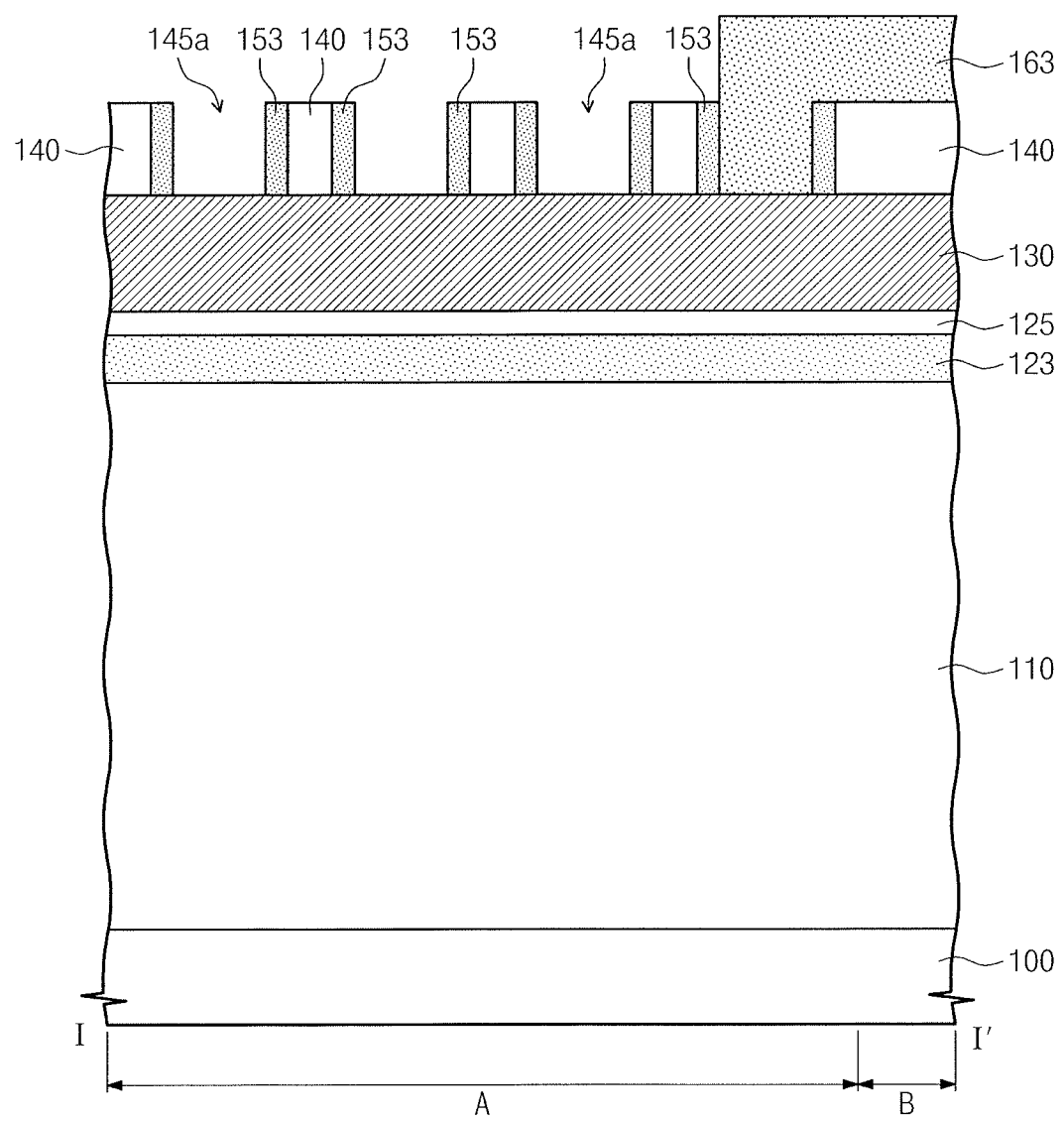

Referring to FIGS. 11A and 11B, after the assistance spacers 153 are formed in the enlarged preliminary openings 145, as described with reference to FIGS. 3A to 3C, a cell open mask pattern 163 may be formed on the sacrificial layer 140 of the peripheral region B to expose the cell region A. The cell open mask pattern 163 may cover the sacrificial layer 140 in the peripheral region B and a portion of the cell region A adjacent to the peripheral region B. For example, the cell open mask pattern 163 may cover portions of the assistance spacers 153 arranged along one row and one column adjacent to the peripheral region B. In some embodiments, the cell open mask pattern 163 may fill inner spaces 145a defined by the assistance spacers 153 arranged along the one row and the one column adjacent to the peripheral region B. The cell open mask pattern 163 may be formed of a material having an etch selectivity with respect to the sacrificial layer 140, the assistance spacers 153, and the mask layer 130. For example, the cell open mask pattern 163 may be formed of photoresist.

Figure 12A:
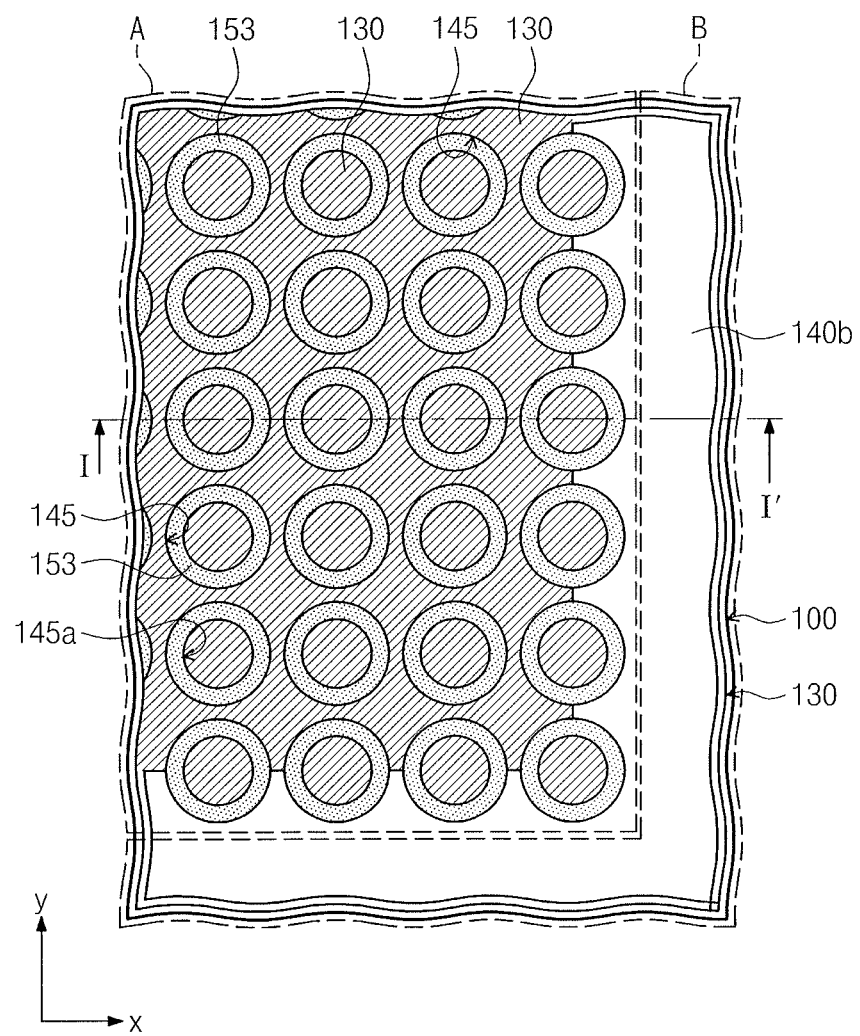
Figure 12B:
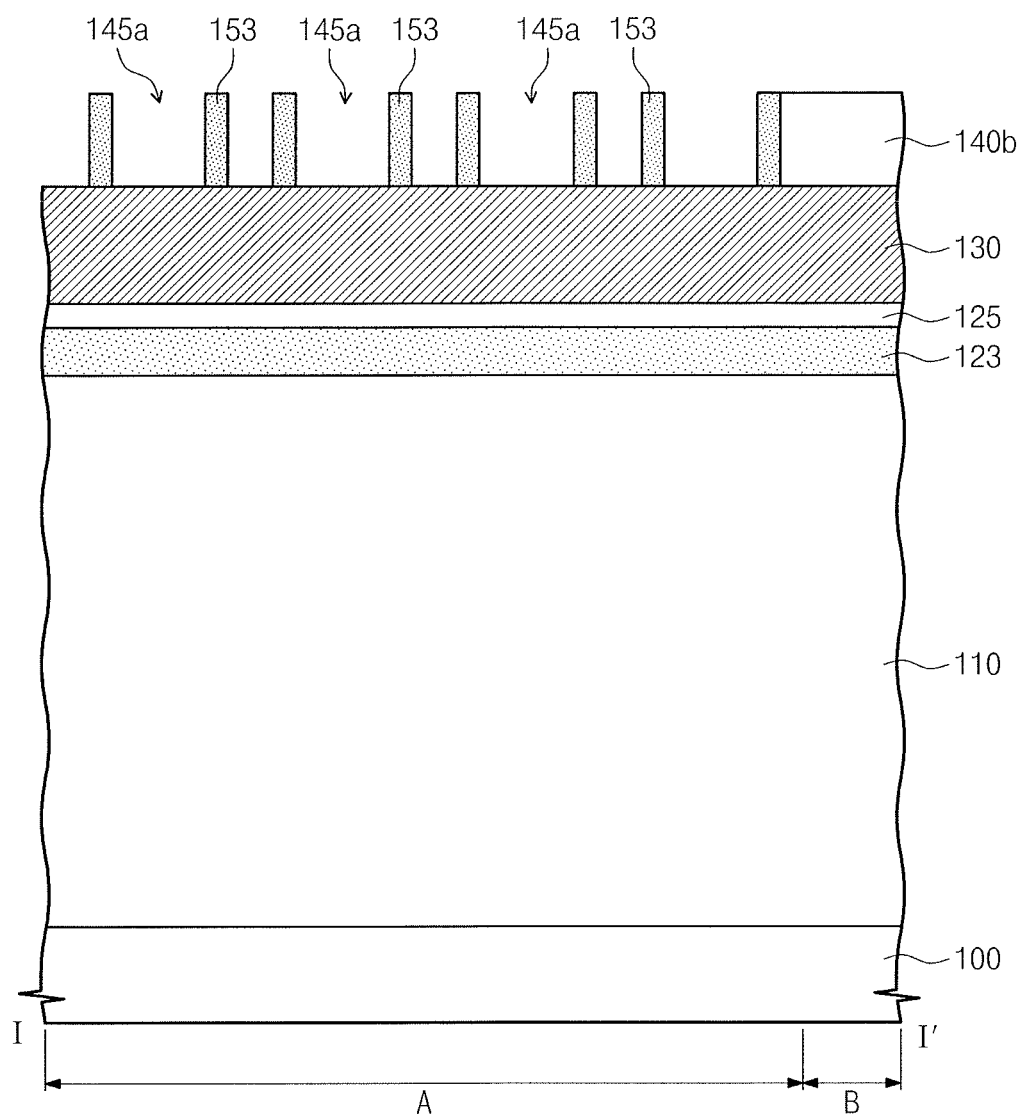

Referring to FIGS. 12A and 12B, the sacrificial layer 140 of the cell region A may be removed. The sacrificial layer 140 may be removed by an isotropic etching process using an etchant having an etch selectivity with respect to the assistance spacer 153 and the mask layer 130. In the present embodiments, the sacrificial layer 140 of the cell region A adjacent to the peripheral region B may remain. In other words, the sacrificial layer 140 of the peripheral region B and a portion of the sacrificial layer 140 of the cell region A adjacent to the peripheral region B may remain to form a peripheral sacrificial pattern 140b. The remaining portion of the sacrificial layer 140 in the cell region A of the peripheral sacrificial pattern 140b may cover portions of outer sidewalls of the assistance spacers 153 arranged along the one row and the one column adjacent to the peripheral region B.

Figure 13A:
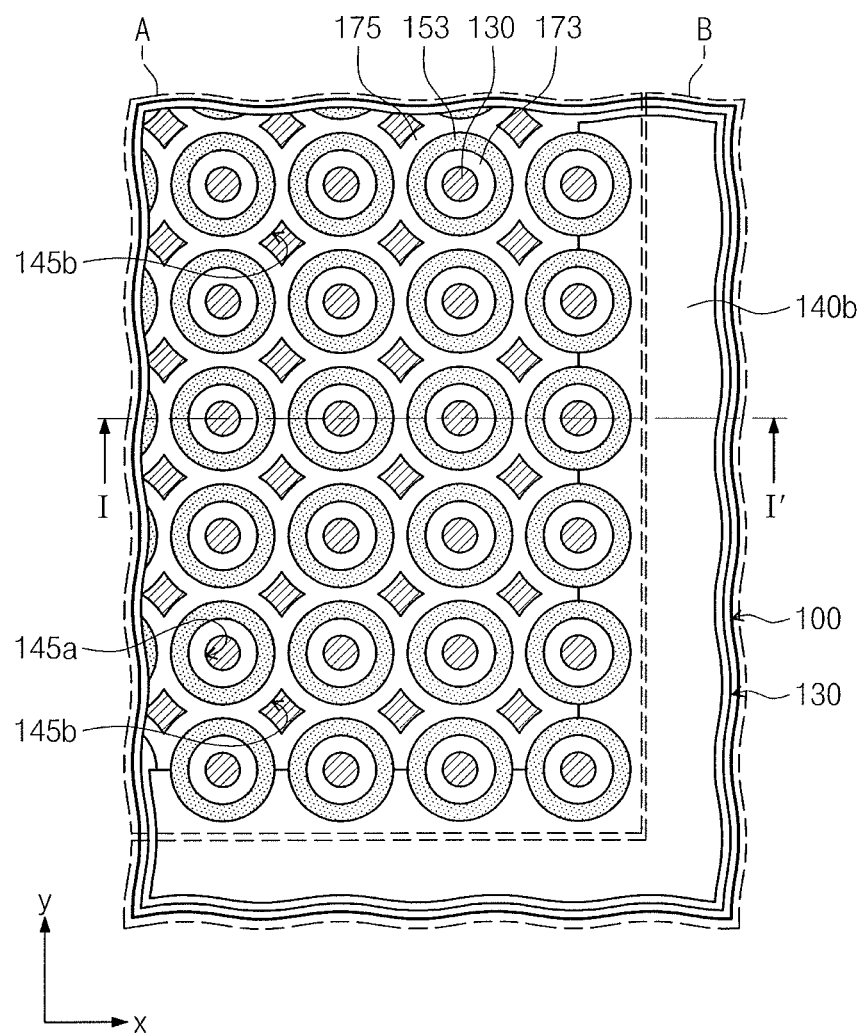
Figure 13B:
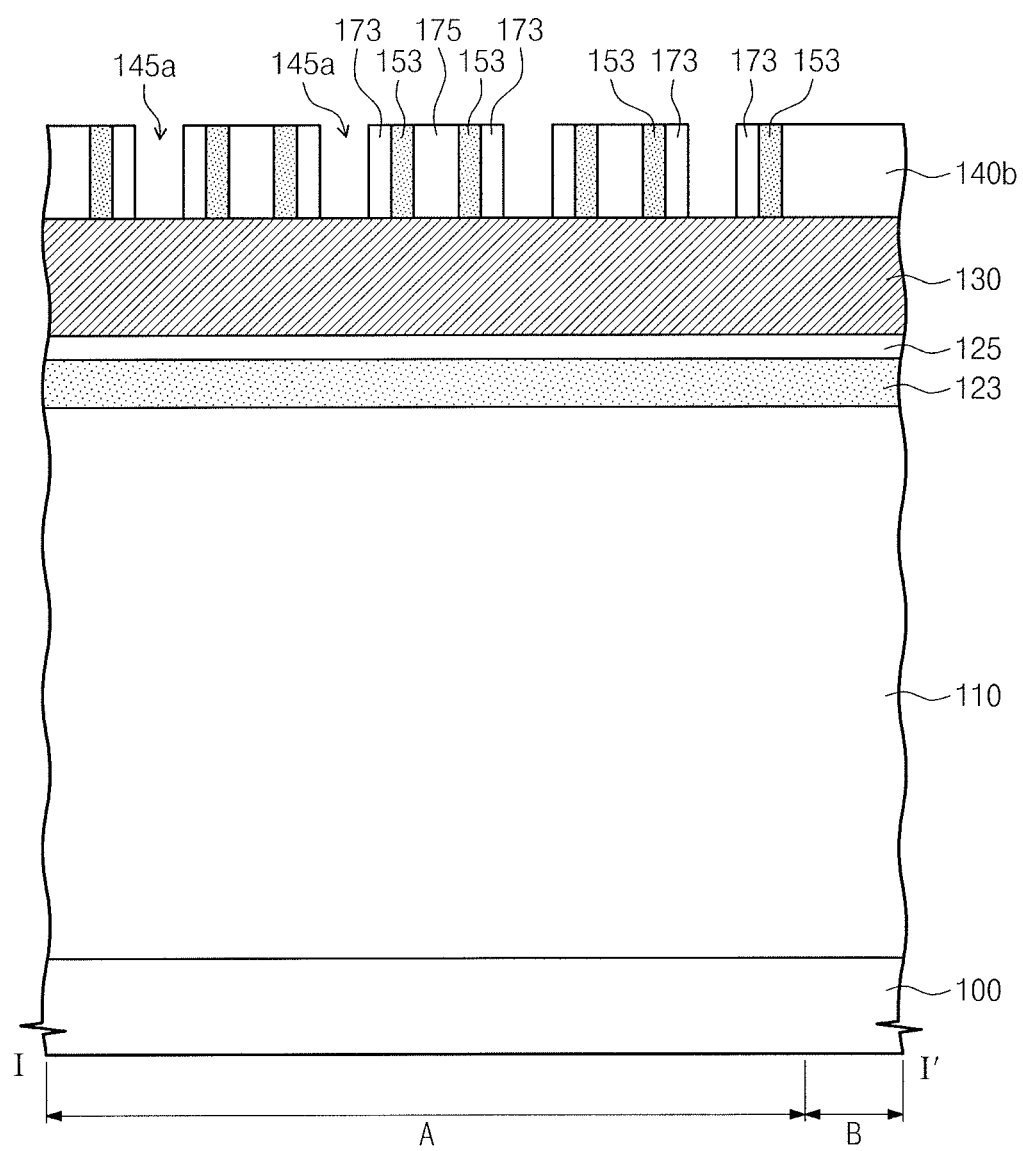

Referring to FIGS. 13A and 13B, the first mask spacers 173 and the second mask spacer 175 may be formed on the mask layer 130, as described with reference to FIGS. 5A to 5C. The first opening 145b may be defined in the inner space 145a by each of the first mask spacer 173, and the second openings 145c exposing the top surface of the mask layer 130 may be defined by the second mask spacer 175. The first openings 145b and the second openings 145c may have the same shape and be formed by the same method as described with reference to FIGS. 5A to 5C.

Figure 14A:
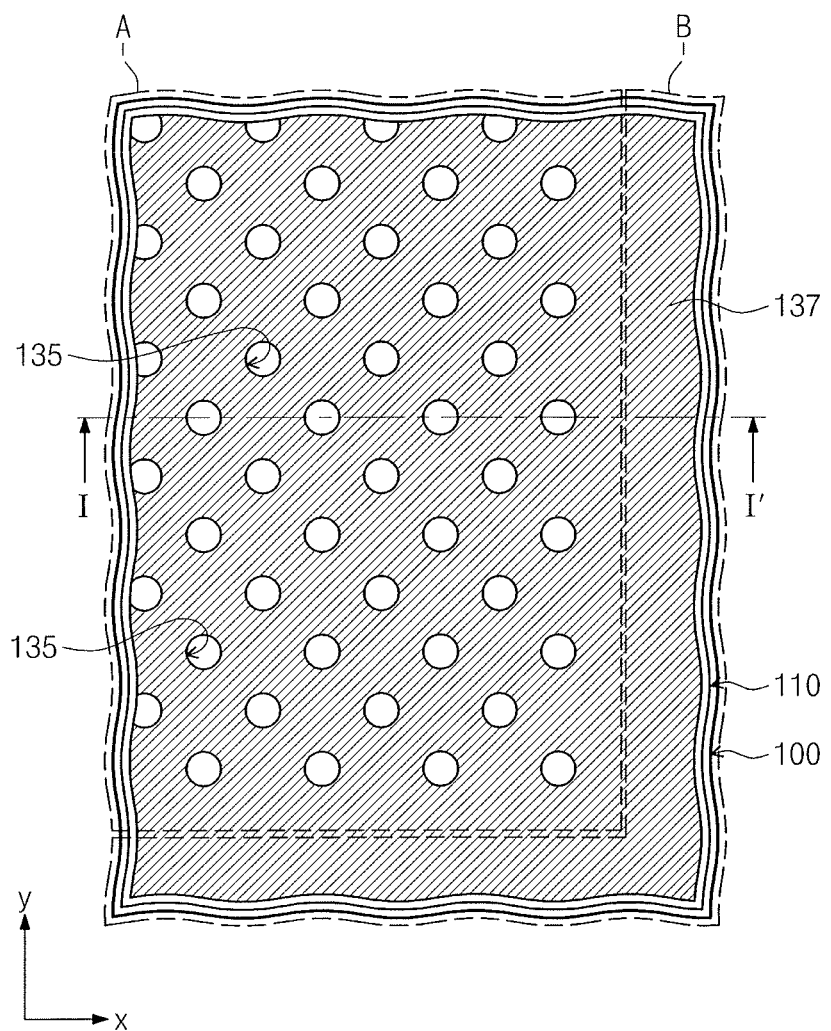
Figure 14B:
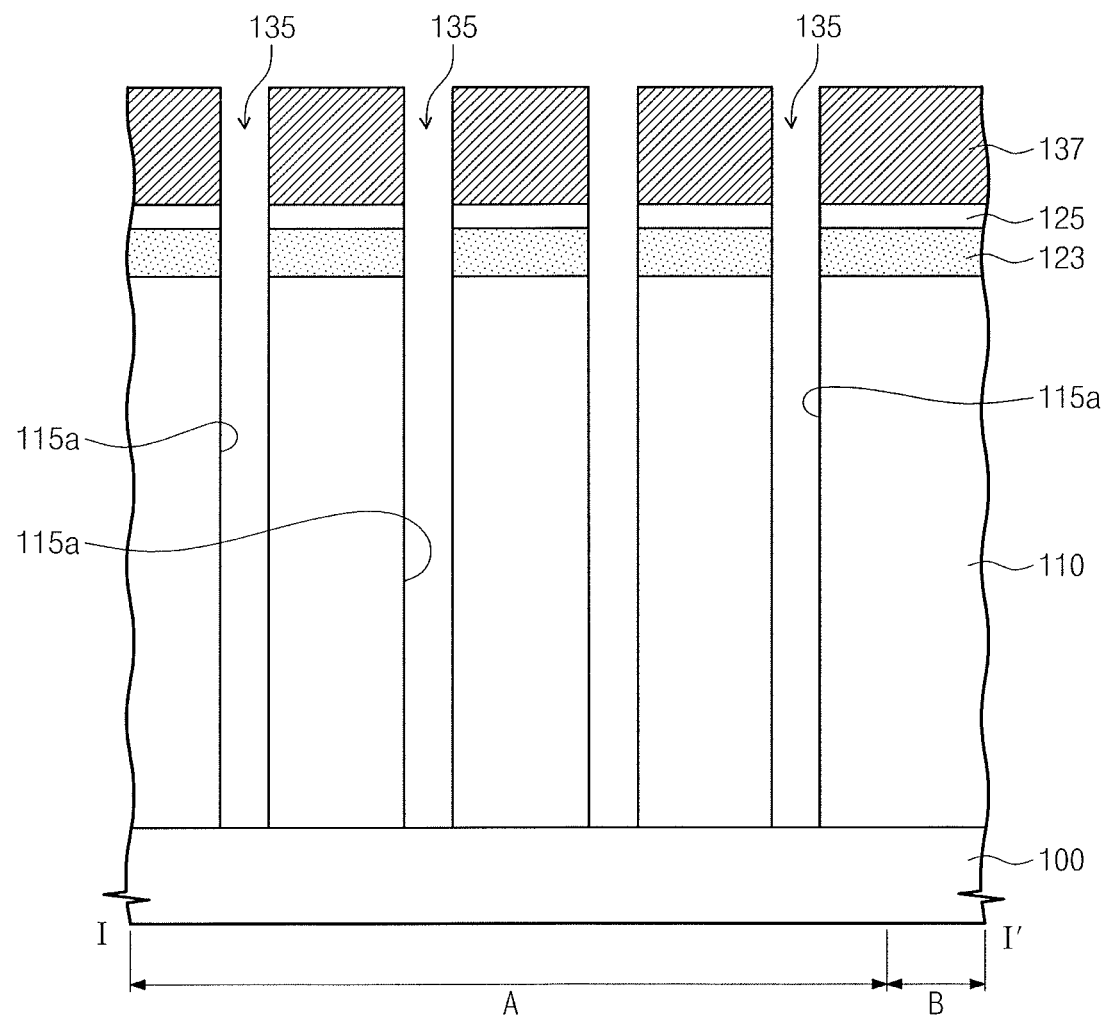

Referring to FIGS. 14A and 14B, the mask layer 130 may be etched to form a mask pattern 137. The mask pattern 137 may be formed by an anisotropic etching process using the assistance spacers 153, the first mask spacers 173, the second mask spacer 175, and the peripheral sacrificial pattern 140b as etch masks.

The mask pattern 137 may have a plurality of mask holes 135 defined by the first openings 145b and the second openings 145c. In other words, portions of the mask layer 130 exposed by the first openings 145b and the second openings 145c may be etched to form the mask holes 135 exposing the buffer oxide layer 125.

The buffer oxide layer 125, the supporting layer 123, and the mold layer 110 may be successively etched using the mask pattern 137 as an etch mask. Thus, a plurality of the holes 115a may be formed in the mold layer 110 in the cell region A. The holes 115a may expose the top surface of the substrate 100.

According to the present embodiment, the mask pattern 137 of the cell region A may be connected to the mask pattern 137 of the peripheral region B, differently from the embodiment described with reference to FIGS. 1A to 10A, 1B to 10B, and 1C to 7C. In other words, the mask pattern 137 may cover the mold layer 110 in the peripheral region B and the boundary region between the cell region A and the peripheral region B. Thus, the mold layer 110 in the boundary region between the cell region A and the peripheral region B may not be etched, so that the mold layer 110 of the peripheral region B and the mold layer 110 of the cell region A may not be separated from each other, unlike the embodiment described with reference to FIGS. 1A to 10A, 1B to 10B, and 1C to 7C.

Figure 15A:
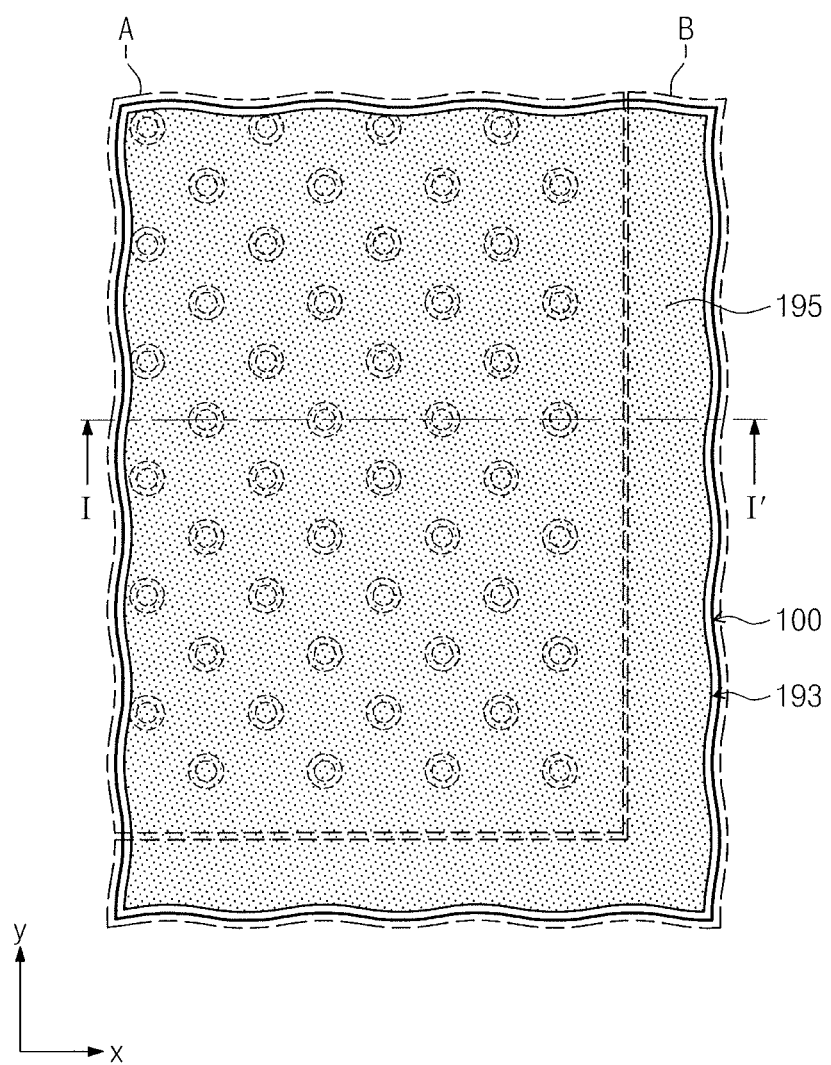
Figure 15B:
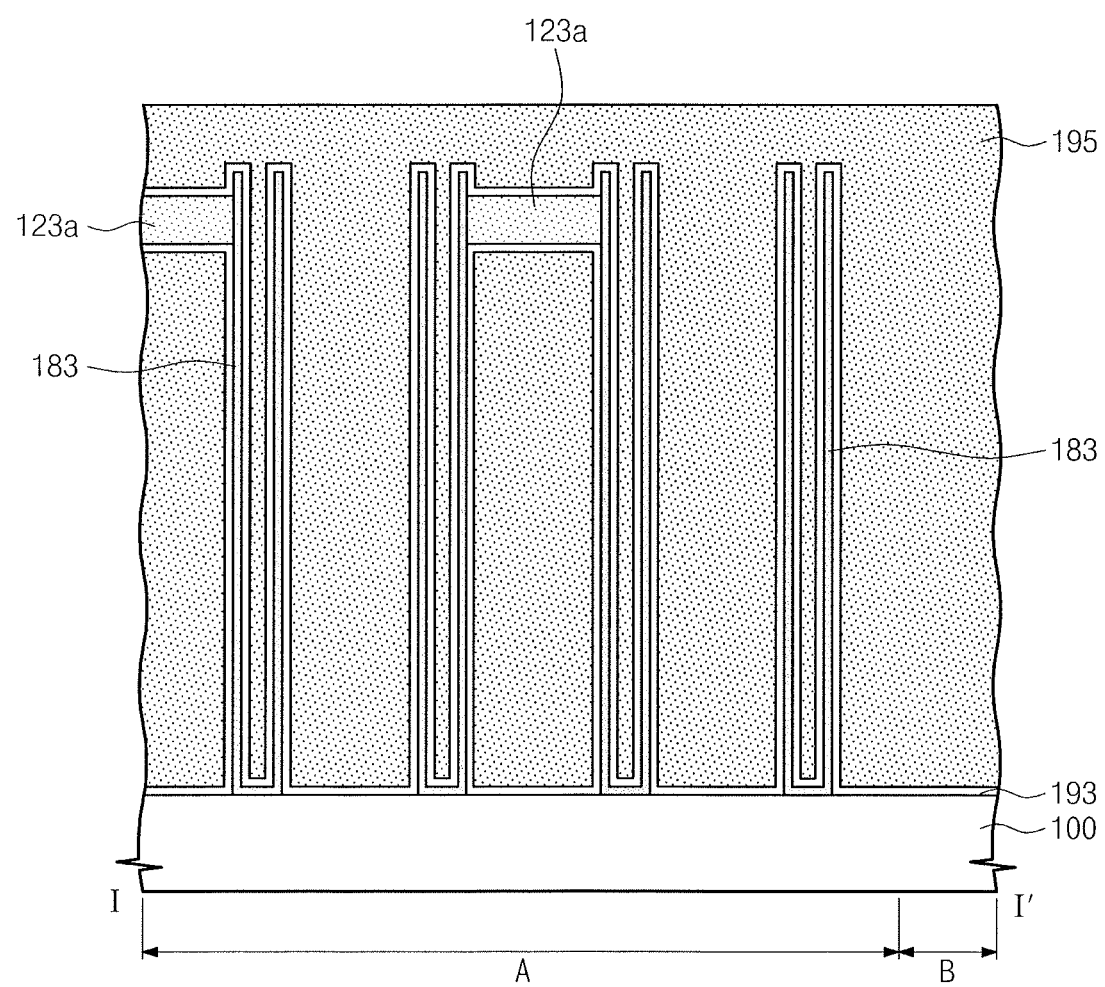

Referring to FIGS. 15A and 15B, the first electrodes 183 may be formed in the holes 115a, respectively. According to the present embodiment, unlike the embodiment in FIGS. 1A-10C, the mold layer 110 of the peripheral region B and the mold layer 110 of the cell region A are separated from each other, so that a dummy pattern is not formed in the boundary region of the cell region A and the peripheral region B.

The buffer oxide layer 125 and supporting layer 123 may be patterned to form the supporting pattern 123a and the buffer oxide pattern 125a. After the supporting pattern 123a and the buffer oxide pattern 125a are formed, the mold layer 110 and the buffer oxide pattern 125a may be removed. According to the present embodiment, since the dummy pattern is not formed in the boundary region of the cell region A and the peripheral region B, the mold layer 110 of the cell region A and the mold layer 110 of the peripheral region B may be removed simultaneously.

After the mold layer 110 is removed, a capacitor dielectric layer 193 may be conformally formed on the substrate 100, and then a second electrode layer 195 may be formed on the substrate 100.

The method according to the present embodiment may achieve the same effect as the embodiment described with reference to FIGS. 1A to 10A, 1B to 10B, and 1C to 7C.

The semiconductor memory devices according to embodiments described above may be encapsulated using various packaging techniques. For example, the semiconductor memory devices according to the aforementioned embodiments may be encapsulated using any one of a package on package (POP) technique, a ball grid arrays (BGAs) technique, a chip scale packages (CSPs) technique, a plastic leaded chip carrier (PLCC) technique, a plastic dual in-line package (PDIP) technique, a die in waffle pack technique, a die in wafer form technique, a chip on board (COB) technique, a ceramic dual in-line package (CERDIP) technique, a plastic metric quad flat package (PMQFP) technique, a plastic quad flat package (PQFP) technique, a small outline package (SOIC) technique, a shrink small outline package (SSOP) technique, a thin small outline package (TSOP) technique, a thin quad flat package (TQFP) technique, a system in package (SIP) technique, a multi chip package (MCP) technique, a wafer-level fabricated package (WFP) technique and a wafer-level processed stack package (WSP) technique.

The package in which the semiconductor memory device according to one of the above embodiments is mounted may further include at least one semiconductor device (e.g., a controller and/or a logic device) that controls the semiconductor memory device.

Figure 16:
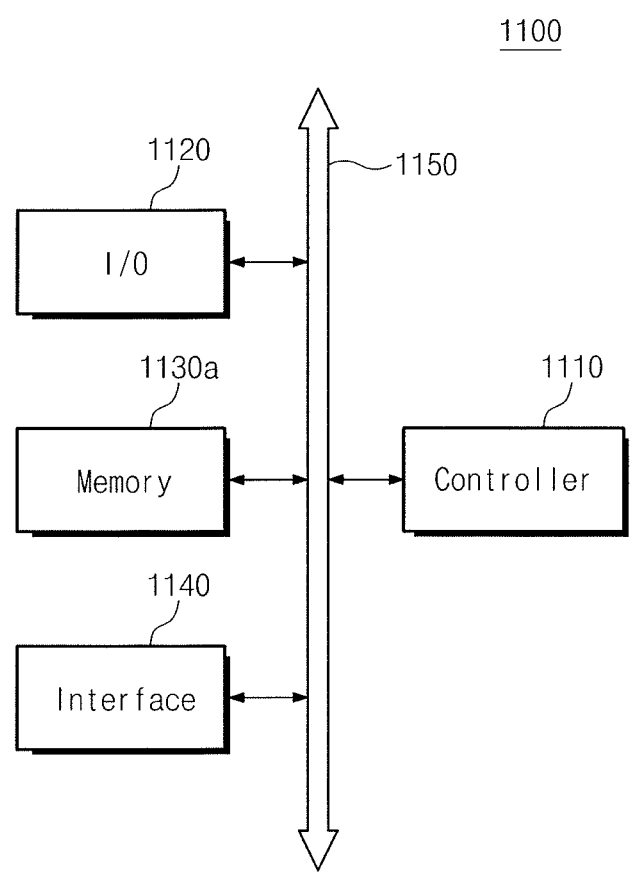
FIG. 16 illustrates a schematic block diagram of an electronic system including semiconductor memory devices according to embodiments of the inventive concept.

FIG. 16 is a schematic block diagram illustrating an example of an electronic system including semiconductor memory devices according to embodiments of the inventive concept. Referring to FIG. 16, an electronic system 1100 according to an embodiment of the inventive concept may include a controller 1110, an input/output (I/O) unit 1120, a memory device 1130a, an interface unit 1140, and a data bus 1150. At least two of the controller 1110, the I/O unit 1120, the memory device 1130a, and the interface unit 1140 may communicate with each other through the data bus 1150. The data bus 1150 may correspond to a path through which electrical signals are transmitted.

The controller 1110 may include, e.g., at least one of a microprocessor, a digital signal processor, a microcontroller, or another logic device. The other logic device may have a similar function to any one of the microprocessor, the digital signal processor, and the microcontroller. The I/O unit 1120 may include, e.g., a keypad, a keyboard, and/or a display unit. The memory device 1130a may store data and/or commands. The memory device 1130a may include at least one of the semiconductor memory devices according to the embodiments described above. The memory device 1130a may further include other type of semiconductor memory devices which are different from the semiconductor devices described above. For example, the memory device 1130 may further include a non-volatile memory device (e.g. a flash memory device, a magnetic memory device, a phase change memory device, etc) and/or a static random access memory (SRAM) device. The interface unit 1140 may transmit electrical data to a communication network or may receive electrical data from a communication network. The interface unit 1140 may operate by wireless or cable. For example, the interface unit 1140 may include an antenna for wireless communication or a transceiver for cable communication. Although not shown in the drawings, the electronic system 1100 may further include a fast DRAM device and/or a fast SRAM device which acts as a cache memory for improving an operation of the controller 1110.

The electronic system 1100 may be applied to, e.g., a personal digital assistant (PDA), a portable computer, a web tablet, a wireless phone, a mobile phone, a digital music player, a memory card, or other electronic products. The other electronic products may receive or transmit information data by wireless.

Figure 17:
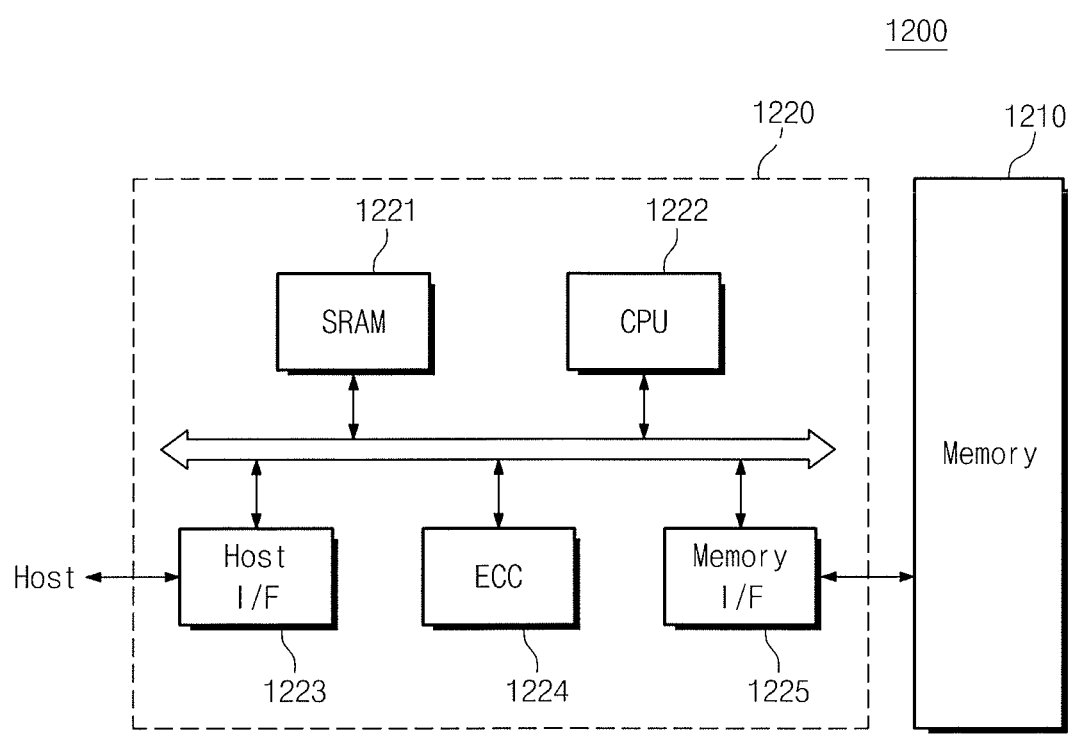
FIG. 17 illustrates a schematic block diagram of a memory card including semiconductor memory devices according to embodiments of the inventive concept.

FIG. 17 is a schematic block diagram illustrating an example of a memory card including semiconductor memory devices according to embodiments of the inventive concept.

Referring to FIG. 17, a memory card 1200 according to an embodiment of the inventive concept may include a memory device 1210. The memory device 1210 may include at least one of the semiconductor memory devices according to the embodiments mentioned above. In other embodiments, the memory device 1210 may further include other types of semiconductor memory devices which are different from the semiconductor devices according to the embodiments described above. For example, the memory device 1210 may further include a non-volatile memory device (e.g. a flash memory device, a magnetic memory device, a phase change memory device, etc) and/or a static random access memory (SRAM) device. The memory card 1200 may include a memory controller 1220 that controls data communication between a host and the memory device 1210.

The memory controller 1220 may include a central processing unit (CPU) 1222 that controls overall operations of the memory card 1200. In addition, the memory controller 1220 may include a SRAM device 1221 used as an operation memory of the CPU 1222. Moreover, the memory controller 1220 may further include a host interface unit 1223 and a memory interface unit 1225. The host interface unit 1223 may be configured to include a data communication protocol between the memory card 1200 and the host. The memory interface unit 1225 may connect the memory controller 1220 to the memory device 1210. The memory controller 1220 may further include an error check and correction (ECC) block 1224. The ECC block 1224 may detect and correct errors of data which are read out from the memory device 1210. Even though not shown in the drawings, the memory card 1200 may further include a read only memory (ROM) device that stores code data to interface with the host. The memory card 1200 may be used as a portable data storage card. Alternatively, the memory card 1200 may be realized as solid state disks (SSD) which are used as hard disks of computer systems.

According to embodiments of the inventive concept, for forming holes in an etch target layer, the first openings may be defined using the assistance spacers and the first mask spacers in the preliminary openings formed by the lithography process, and the second openings may be defined between the first openings by the assistance spacers and the second mask spacer. Thus, it is possible to form the holes having intervals shorter than a minimum interval between holes defined by the lithography equipment. As a result, a semiconductor memory device with higher integration may be realized. Additionally, since the usage of high cost lithography equipment may be decreased in the method of manufacturing the high integrated semiconductor memory device, it is possible to reduce a manufacturing cost of the semiconductor memory device.

Example embodiments have been disclosed herein, and although specific terms are employed, they are used and are to be interpreted in a generic and descriptive sense only and not for purpose of limitation. Accordingly, it will be understood by those of skill in the art that various changes in form and details may be made without departing from the spirit and scope of the present invention as set forth in the following claims.

What is claimed is:

1. A method of forming a semiconductor memory device, comprising:
    forming an etch target layer on a substrate;
    forming a sacrificial layer having preliminary openings on the etch target layer;
    forming assistance spacers in the preliminary openings, respectively;
    removing the sacrificial layer, such that the assistance spacers remain on the etch target layer;
    forming first mask spacers covering inner sidewalls of the assistance spacers, respectively, the first mask spacers respectively defining first openings;
    forming a second mask spacer covering outer sidewalls of the assistance spacers, the second mask spacer defining second openings between the first openings, the first and second openings being adjacent to each other along a first direction; and
    etching the etch target layer exposed by the first openings and the second openings to form holes in the etch target layer.

2. The method as claimed in claim 1, wherein defining the first openings includes forming the first openings two-dimensionally along rows and columns when viewed from a plan view, such that the rows are along a second direction and the columns are along a third direction crossing the second direction, and the first direction is non-parallel and non-perpendicular to the second and third directions.

3. The method as claimed in claim 2, wherein forming the first mask spacers and forming the second mask spacer is simultaneous.

4. The method as claimed in claim 3, wherein forming the first mask spacers and the second mask spacer includes:
    forming a mask spacer layer on the etch target layer and the assistance spacers; and
    etching the mask spacer layer until a top surface of the etch target layer is exposed.

5. The method as claimed in claim 4, wherein forming the mask spacer layer includes depositing the mask spacer layer to a deposition thickness greater than a half of the shortest distance between a pair of the assistance spacers adjacent to each other in the second direction and a half of the shortest distance between a pair of the assistance spacers adjacent to each other in the third direction.

6. The method as claimed in claim 2, wherein forming the second mask spacer includes filling with the second mask spacer a part of a space between the assistance spacers adjacent to each other in the second direction and a part of a space between the assistance spacers adjacent to each other in the third direction.

7. The method as claimed in claim 2, wherein:
    a distance between center points of two holes adjacent to each other in the first direction is represented as $R_3$,
    a distance between center points of two holes adjacent to each other in the second direction is represented as $R_2$, a distance between center points of two holes adjacent to each other in the third direction is represented as $R_1$, and $R_3$ is represented by the following formula: $R_3=((R_1^2+R_2^2)/4)^{1/2}$.

8. The method as claimed in claim 7, wherein the $R_1$ is equal to the $R_2$, and $R_3$ is represented by the following formula: $R_3=R_1/(2^{1/2})$.

9. The method as claimed in claim 1, further c v preliminary openings to enlarge the preliminary openings.

10. The method as claimed in claim 1, wherein forming the sacrificial layer includes using a material having an etch selectivity with respect to the etch target layer and the assistance spacers.

11. A method of forming a semiconductor memory device, comprising:
    forming an etch target layer on a substrate;
    forming a plurality of assistance spacers on the etch target layer, the assistance spacers being spaced apart from each other, and each of the assistance spacers defining an inner space exposing the etch target layer and an outer space exposing the etch target layer between the assistance spacers adjacent to each other;
    forming a mask spacer layer on the etch target layer to fill a part of the inner space and a part of the outer space;
    anisotropically etching the mask spacer layer until the etch target layer is exposed, such that openings exposing the etch target layer are formed, the openings including first openings exposing the etch target layer in the inner space and second openings exposing the etch target layer in the outer space; and
    forming holes by etching the etch target layer exposed through the openings.

12. The method as claimed in claim 11, wherein forming the mask spacer layer includes depositing the mask spacer layer to a thickness that is greater than a half of the shortest distance between adjacent assistance spacers.

13. The method as claimed in claim 11, wherein forming the openings includes arranging the openings two-dimensionally in rows along a first direction and in columns along a second direction when viewed from a plan view, the second direction being perpendicular to the first direction,
    wherein center points of the openings arranged in two adjacent rows are misaligned in the second direction, and
    wherein center points of the openings arranged in two adjacent columns are misaligned in the first direction.

14. The method as claimed in claim 13, wherein forming the openings includes:
    forming the first openings in a first column of the two adjacent columns by etching through the defined inner spaces of the assistance spacers; and
    forming the second openings in a second column of the two adjacent columns by etching through the defined outer spaces between the assistance spacers.

15. A method of forming a semiconductor memory device, comprising:
    forming an etch target layer on a substrate;
    forming a plurality of assistance spacers on the etch target layer;
    forming first mask spacers on inner sidewalls of the assistance spacers, the first mask spacers defining first openings in centers of the assistance spacers;
    forming a second mask spacer on outer sidewalls of the assistance spacers, the second mask spacer defining second openings, each second opening being between two adjacent first openings along a first direction; and
    etching the etch target layer through the first and second openings to form holes in the etch target layer.

16. The method as claimed in claim 15, wherein:
    forming the plurality of assistance spacers includes forming a two dimensional matrix of assistance spacers, each spacer defining an inner space therein, and
    forming the second openings along the first direction includes forming the second openings along a diagonal direction of the matrix.

17. The method as claimed in claim 15, wherein:
    forming the first mask spacers includes defining a size of the assistance spacers by a minimal distance of a lithography equipment, such that the first openings in respective centers of the assistance spacers are formed at the minimal distance of the lithography equipment; and
    forming the second mask spacer includes forming the assistance spacers with small distances therebetween, such that a deposition thickness of a mask spacer layer is greater than a half of the shortest distance between a pair of the assistance spacers in a second or third direction, the second and third directions being perpendicular to each other.

18. The method as claimed in claim 17, wherein forming the assistance spacers includes:
    forming preliminary openings through a sacrificial layer, centers of the preliminary openings being defined by the minimal distance of the lithography equipment;
    etching the preliminary openings to expand diameters thereof, such that distances between the expanded preliminary openings along the second and third directions are reduced;
    coating inner sidewalls of the preliminary openings; and
    removing the sacrificial layer, such that the coating on the inner sidewalls of the preliminary openings defines the assistance spacers.

19. The method as claimed in claim 15, wherein forming the holes includes forming a matrix with a plurality of first and second columns, the first and second columns being arranged to alternate and be offset with respect to each other.

20. The method as claimed in claim 19, wherein forming the holes includes forming the first columns to include the first openings and the second columns to include the second openings, centers of the first openings being misaligned with respect to centers of the second openings.

* * * * *